(12) United States Patent
Lee et al.

(10) Patent No.: US 8,941,216 B2
(45) Date of Patent: Jan. 27, 2015

(54) SEMICONDUCTOR DEVICES HAVING THROUGH-VIAS AND METHODS FOR FABRICATING THE SAME

(71) Applicant: Samsung Electronics Co., Ltd., Suwon-si (KR)

(72) Inventors: Kyu-Ha Lee, Yongin-si (KR); Ho-Jin Lee, Seoul (KR); Pil-Kyu Kang, Anyang-si (KR); Byung Lyul Park, Seoul (KR); Hyunsoo Chung, Hwaseong-si (KR); Gilheyun Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 30 days.

(21) Appl. No.: 13/749,727

(22) Filed: Jan. 25, 2013

(65) Prior Publication Data

US 2013/0207241 A1  Aug. 15, 2013

(30) Foreign Application Priority Data

Feb. 13, 2012  (KR) ........................ 10-2012-0014360

(51) Int. Cl.
*H01L 23/522* (2006.01)
*H01L 21/768* (2006.01)
(Continued)

(52) U.S. Cl.
CPC ...... *H01L 23/5226* (2013.01); *H01L 21/76898* (2013.01); *H01L 23/481* (2013.01);
(Continued)

(58) Field of Classification Search
CPC ............ H01L 21/6898; H01L 21/5226; H01L 21/4763
USPC .................................. 257/621; 438/612, 614
See application file for complete search history.

(56) References Cited

U.S. PATENT DOCUMENTS 7,094,701 B2   8/2006  Umemoto et al.
7,122,457 B2  10/2006  Tanida et al.
(Continued)

FOREIGN PATENT DOCUMENTS

JP   2005-243689   9/2005
JP   2006-012953   1/2006
(Continued)

*Primary Examiner* — Matthew W Such
*Assistant Examiner* — Warren H Kilpatrick
(74) *Attorney, Agent, or Firm* — Myers Bigel Sibley & Sajovec, P.A.

(57) ABSTRACT

The inventive concept provides semiconductor devices having through-vias and methods for fabricating the same. The method may include forming a via-hole opened toward a top surface of a substrate and partially penetrating the substrate, forming a via-insulating layer having a first thickness on a bottom surface of the via-hole and a second thickness smaller than the first thickness on an inner sidewall of the via-hole, forming a through-via in the via-hole which the via-insulating layer is formed in, and recessing a bottom surface of the substrate to expose the through-via. Forming the via-insulating layer may include forming a flowable layer on the substrate, and converting the flowable layer into a first flowable chemical vapor deposition layer having the first thickness on the bottom surface of the via-hole.

7 Claims, 44 Drawing Sheets

(51) Int. Cl.
*H01L 23/48* (2006.01)
*H01L 25/065* (2006.01)
*H01L 23/00* (2006.01)
*H01L 23/31* (2006.01)

(52) U.S. Cl.
CPC ........... *H01L 25/0657* (2013.01); *H01L 24/05* (2013.01); *H01L 24/06* (2013.01); *H01L 23/3128* (2013.01); *H01L 2224/0557* (2013.01); *H01L 2225/06517* (2013.01); *H01L 2924/15311* (2013.01); *H01L 2225/06513* (2013.01); *H01L 2225/06565* (2013.01); *H01L 2225/06544* (2013.01); *H01L 24/13* (2013.01); *H01L 24/16* (2013.01); *H01L 2224/02372* (2013.01); *H01L 2224/05548* (2013.01); *H01L 2224/05567* (2013.01); *H01L 2224/06181* (2013.01); *H01L 2224/13022* (2013.01); *H01L 2224/16148* (2013.01); *H01L 2224/16227* (2013.01); *H01L 2224/05572* (2013.01); *H01L 2224/131* (2013.01); *H01L 2224/16225* (2013.01)
USPC ........................................................ 257/621

(56) References Cited

U.S. PATENT DOCUMENTS

| | | | |
|---|---|---|---|
| 7,282,444 | B2 | 10/2007 | Tanida et al. |
| 7,358,602 | B2 | 4/2008 | Hara |
| 7,777,323 | B2 | 8/2010 | Kwon et al. |
| 7,897,459 | B2 | 3/2011 | Uchiyama |
| 7,994,048 | B2 | 8/2011 | Komuro |
| 8,026,592 | B2 | 9/2011 | Yoon et al. |
| 8,039,962 | B2 | 10/2011 | Lee et al. |
| 8,141,243 | B2 | 3/2012 | Nakamura |
| 2010/0158296 | A1* | 6/2010 | Dumas et al. ................. 381/328 |
| 2010/0237502 | A1 | 9/2010 | Yu et al. |
| 2012/0261827 | A1* | 10/2012 | Yu et al. ....................... 257/774 |

FOREIGN PATENT DOCUMENTS

| | | |
|---|---|---|
| JP | 2007-242812 | 9/2007 |
| JP | 2008-226882 | 9/2008 |
| JP | 2010-141149 | 6/2010 |
| KR | 1020080082491 A | 9/2008 |
| KR | 1020080090826 A | 10/2008 |
| KR | 1020100049459 A | 5/2010 |
| KR | 1020100138224 A | 12/2010 |

* cited by examiner

SEMICONDUCTOR DEVICES HAVING THROUGH-VIAS AND METHODS FOR FABRICATING THE SAME

CROSS-REFERENCE TO RELATED APPLICATIONS

This U.S. non-provisional patent application claims priority under 35 U.S.C. §119 to Korean Patent Application No. 10-2012-0014360, filed on Feb. 13, 2012, the entirety of which is incorporated by reference herein.

BACKGROUND

Embodiments of the inventive concept relate to semiconductor devices and, more particularly, to semiconductor devices having through-vias and methods for fabricating the same.

Generally, for electrically insulating a through silicon via (TSV) from a substrate, a via-insulating layer may be formed by a chemical vapor deposition (CVD) process and a bottom surface of the substrate may be recessed such that the TSV protrudes therefrom. If the via-insulating layer is etched during this process, the TSV may be exposed. The exposed portion of the TSV may function as a contamination or a particle-source, such that errors of subsequent processes may occur.

SUMMARY

Embodiments of the inventive concept may provide semiconductor devices having excellent reliability and improved yield and methods for fabricating the same.

Embodiments of the inventive concept may also provide semiconductor devices having a simple structure and methods for fabricating the same.

In one aspect, a method for fabricating a semiconductor device may include: forming a via-hole opened toward a top surface of a substrate and partially penetrating the substrate; forming a via-insulating layer having a first thickness on a bottom surface of the via-hole and a second thickness on an inner sidewall of the via-hole, the second thickness smaller than the first thickness; forming a through-via in the via-hole in which the via-insulating layer is formed; and recessing a bottom surface of the substrate to expose the through-via. Forming the via-insulating layer may include: forming a flowable layer on the substrate; and converting the flowable layer into a first flowable chemical vapor deposition layer having the first thickness on the bottom surface of the via-hole.

In some embodiments, forming the via-insulating layer may further include: forming a second flowable chemical vapor deposition layer having the second thickness on the inner sidewall of the via-hole. The second flowable chemical vapor deposition layer may be formed simultaneously with the first flowable chemical vapor deposition layer.

In other embodiments, forming the via-insulating layer may further include: before forming the flowable layer, forming an insulating layer extending along the inner sidewall and the bottom surface of the via-hole, the insulating layer having a thickness less than the first thickness of the first flowable chemical vapor deposition layer.

In still other embodiments, forming the via-insulating layer may further include: after converting the flowable layer into the first flowable chemical vapor deposition layer, forming an insulating layer extending along the inner sidewall of the via-hole and a surface of the first flowable chemical vapor deposition layer, the insulating layer having a thickness less than the first thickness of the first flowable chemical vapor deposition layer.

In even other embodiments, forming the via-insulating layer may further include: after forming the insulating layer, forming a second insulating layer extending along surfaces of the insulating layer and the first flowable chemical vapor deposition layer, the second insulating layer having a thickness less than the first thickness of the first flowable chemical vapor deposition layer.

In yet other embodiments, forming the via-insulating layer may further include: before forming the first flowable chemical vapor deposition layer, forming an insulating layer extending along the inner sidewall and the bottom surface of the via-hole, the insulating layer having a thickness less than the first thickness of the first flowable chemical vapor deposition layer.

In yet still other embodiments, recessing the bottom surface of the substrate to expose the through-via may include: recessing the bottom surface of the substrate to expose the first flowable chemical vapor deposition layer; forming a lower insulating layer covering the first flowable chemical vapor deposition layer on the recessed bottom surface of the substrate; and patterning the lower insulating layer and the first flowable chemical vapor deposition layer to form an opening having a width smaller than a width of the via-hole and exposing a bottom end of the through-via.

In yet still other embodiments, the method may further include: forming a terminal extending in the opening so as to be connected to the bottom end of the through-via on the lower insulating layer. The bottom end of the through-via may not reach the recessed bottom surface of the substrate.

In yet still other embodiments, recessing the bottom surface of the substrate to expose the through-via may include: recessing the bottom surface of the substrate to expose the first flowable chemical vapor deposition layer; forming a lower insulating layer covering the first flowable chemical vapor deposition layer on the recessed bottom surface of the substrate; and planarizing the lower insulating layer and the first flowable chemical vapor deposition layer to expose a bottom end of the through-via.

In yet still other embodiments, the method may further include: forming a terminal connected to the bottom end of the through-via on the lower insulating layer. The bottom end of the through-via may be protruding from the recessed bottom surface of the substrate.

In another aspect, a semiconductor device may include: a substrate having an active surface and a non-active surface opposite to the active surface; a via-hole penetrating the substrate; a first via-insulating layer extending along an inner sidewall of the via-hole from the active surface to the non-active surface; a through-via disposed in the via-hole and surrounded by the first via-insulating layer, a bottom end of the through-via not reaching the non-active surface; a lower insulating layer on the non-active surface of the substrate; and a terminal disposed on the lower insulating layer and connected to the bottom end of the through-via.

In some embodiments, the terminal may include a protrusion extending toward the bottom end of the through-via and connected to the bottom end of the through-via; and the first via-insulating layer electrically may insulate the protrusion from the substrate.

In other embodiments, the semiconductor device may further include: a second via-insulating layer disposed between the through-via and the first via-insulating layer and surrounding a sidewall of the through-via.

In still other embodiments, the second via-insulating layer may extend along the sidewall of the through-via from the active surface to the non-active surface or from the active surface to the bottom end of the through electrode.

In yet other embodiments, the first via-insulating layer may include: a first insulating layer extending along a sidewall of the through-via to the bottom end of the through-via and electrically insulating the through-via from the substrate; and a second insulating layer extending from the first insulating layer to the non-active surface of the substrate and electrically insulating the terminal from the substrate.

In another aspect, a method for fabricating a semiconductor device may include: forming a via-hole opened toward a top surface of a substrate; forming a via-insulating layer comprising a first portion on a bottom surface of the via hole and a second portion on a sidewall of the via hole having thickness less than a thickness of the first portion, wherein, forming the via-insulating layer comprises: forming a flowable layer in the via-hole; converting the flowable layer into the first portion of the via-insulating layer; and forming a through-via in the via-hole in which the via-insulating layer is formed.

In some embodiments, the method may further include recessing a bottom surface of the substrate to expose the first portion of the via-insulating layer and forming a lower insulating layer on the first portion of the via-insulating layer on the recessed bottom surface of the substrate. A bottom end of the through-via may not reach the recessed bottom surface of the substrate.

In some embodiments, forming the via-insulating layer may further include forming a second insulating layer in the via-hole using a different process than a process for forming the first portion of the via-insulating layer. The first portion of the bottom surface of the via-insulating layer may have a first thickness on a bottom surface of the via-hole and the second insulating layer may have a second thickness on the sidewall of the via-hole, the second thickness being smaller than the first thickness. The second insulating layer may extend from a top of the via-hole to the bottom end of the through-via, In some embodiments, the method may further include patterning the lower insulating layer and the second insulating layer to form an opening having a width smaller than a width of the via-hole and exposing the bottom end of the through-via. A residual portion of the first insulating layer may extend along the sidewall of the via-hole from the bottom end of the through-via to the lower insulating layer.

In some embodiments, the method may further include forming a terminal on the lower insulating layer. The terminal may extend into the opening and contact the bottom end of the through-via. The residual portion of the first insulating layer may insulate the substrate from the terminal.

BRIEF DESCRIPTION OF THE DRAWINGS

The inventive concept will become more apparent in view of the attached drawings and accompanying detailed description.

DETAILED DESCRIPTION OF THE EMBODIMENTS

Figure 1:
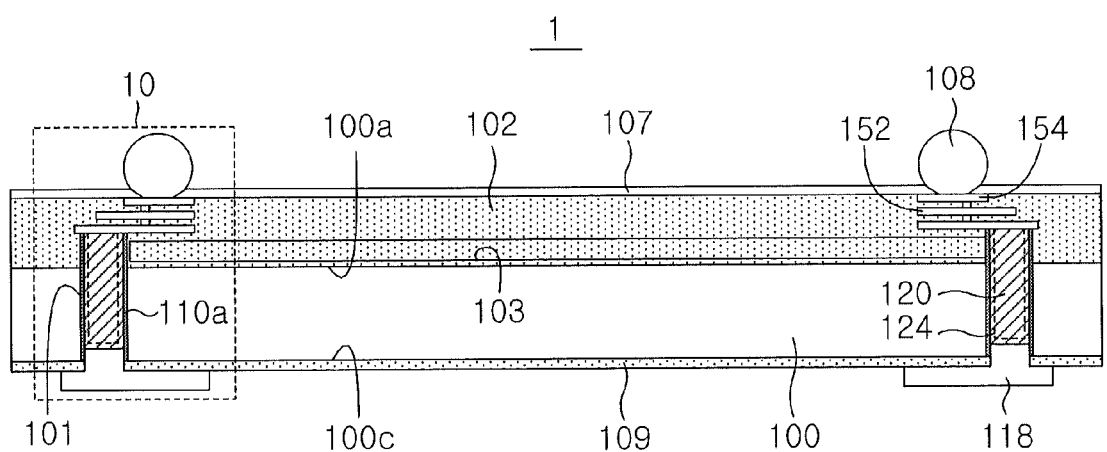
FIG. 1 is a cross-sectional view illustrating a semiconductor device according to embodiments of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiments in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

FIG. 1 is a cross-sectional view illustrating a semiconductor device according to embodiments of the inventive concept.

Referring to FIG. 1, a semiconductor device 1 may include an electrical connection part 10 transmitting an electrical signal. The electrical signal may vertically pass through a substrate 100 via the electrical connection part 10. The electrical connection part 10 may include a through-via 120 filling a via-hole 101 substantially vertically penetrating the substrate 100. A barrier layer 124 may further be provided to surround the through-via 120. A via-insulating layer 110a may be disposed between the through-via 120 and the substrate 100 so as to electrically insulate the through-via 120 from the substrate 100. The semiconductor device 1 may further include at least one of an upper terminal 108 and a lower terminal 118 which are electrically connected to the through-via 120. The upper terminal 108 may be disposed on an active surface 100a of the substrate 100. The lower terminal 118 may be disposed on a non-active surface 100c of the substrate 100. The upper terminal 108 and the lower terminal 118 may include solder balls, solder bumps, re-interconnections, and/or pads. In some embodiments, the upper terminal 108 may include a solder ball and the lower terminal 118 may include a pad.

An integrated circuit 103, a metal interconnection 152, and an interlayer insulating layer 102 may be disposed on the active surface 100a of the substrate 100. The metal interconnection 152 may be electrically connected to the integrated circuit 103 and have a single-layered structure or a multi-layered structure. The interlayer insulating layer 102 may cover the integrated circuit 103 and the metal interconnection 152. An upper insulating layer 107 may be disposed on the interlayer insulating layer 102. The upper insulating layer 107 may open a bonding pad 154 to which the upper terminal 108 is connected. The metal interconnection 152 may be electrically connected to the through-via 120, such that the integrated circuit 103 may be electrically connected to the through-via 120. The through-via 120 may be disposed around the integrated circuit 103 or in the integrated circuit 103. A lower insulating layer 109 opening the through-via 120 may be disposed on the non-active surface 100c of the substrate 100. The electrical connection part 10 may include one of various structures described with reference to FIGS. 2A to 2D below.

FIGS. 2A to 2D are cross-sectional views illustrating various examples of an electrical connection part of a semiconductor device according to embodiments of the inventive concept.

Figure 2A:
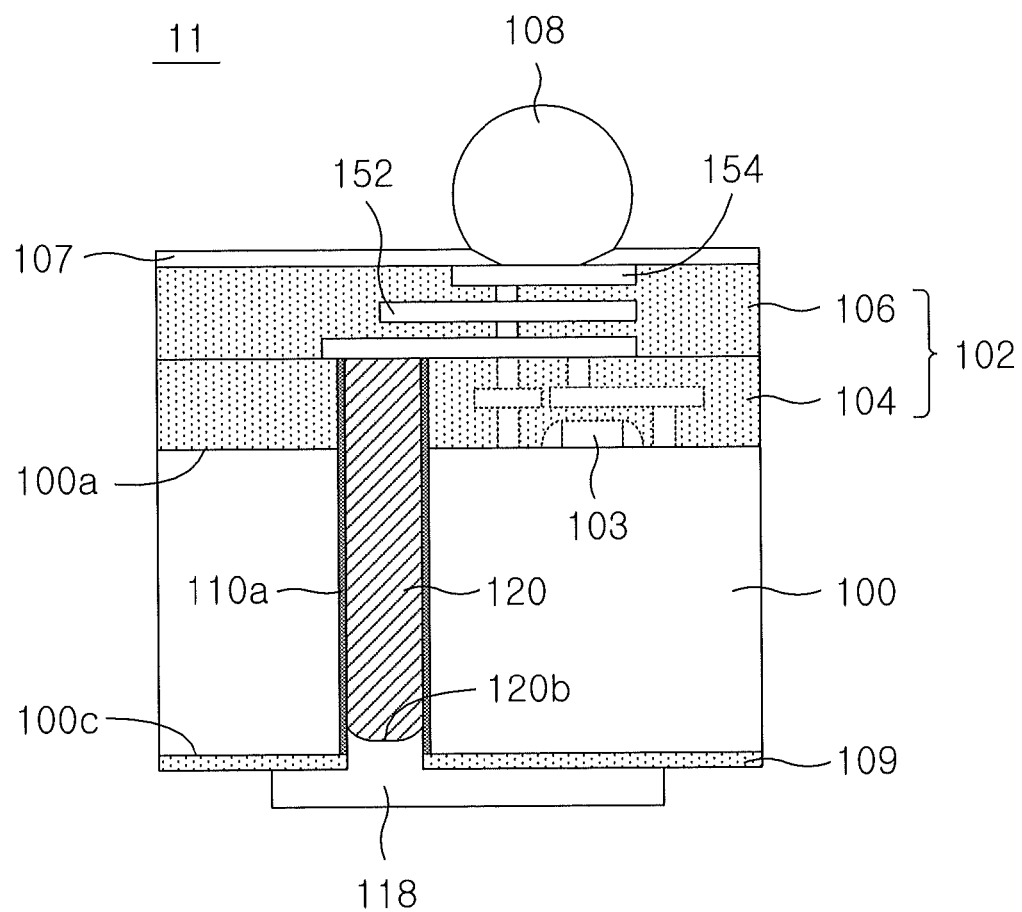
FIGS. 2A to 2D are cross-sectional views illustrating various examples of an electrical connection part of a semiconductor device according to embodiments of the inventive concept.

Referring to FIG. 2A, an electrical connection part 11 may have a via-middle structure. In the via-middle structure, the through-via 120 may be formed after the integrated circuit 103 is formed and before the metal interconnection 152 is formed. The interlayer insulating layer 102 may include a first interlayer insulating layer 104 and a second interlayer insulating layer 106. The first interlayer insulating layer 104 may be formed on the active surface 100a of the substrate 100 and cover the integrated circuit 103. The second interlayer insulating layer 106 may be formed on the first interlayer insulating layer 104 and cover the metal interconnection 152 and the bonding pad 154. The through-via 120 may have a pillar-shape which penetrates the first interlayer insulating layer 104 and partially penetrates the substrate 100. The through-via 120 may be recessed from the non-active surface 100c of the substrate 100. For example, a bottom end 120b of the through-via 120 may be disposed at a level higher than the non-active surface 100c of the substrate 100. The lower terminal 118 may have a shape protruded toward the bottom end 120b of the through-via 120. The lower terminal 118 may be a redistribution pad to connect the through-via 120 to another terminal which is not vertically aligned with the through-via 120. The via-insulating layer 110a may extend along a sidewall of the through-via 120 to reach the non-active surface 100c of the substrate 100. The via-insulating layer 110a may be formed of a silicon oxide layer formed by a flowable chemical vapor deposition (FCVD) method.

The electrical connection part 11 having the via-middle structure may be changed into one of various modified structures. The modified structures 11a, 11b, 11c, and 11d described below may be applied to a via-last structure of FIG. 2B and a via-first structure of FIG. 2C which will be described later.

Figure 5A:
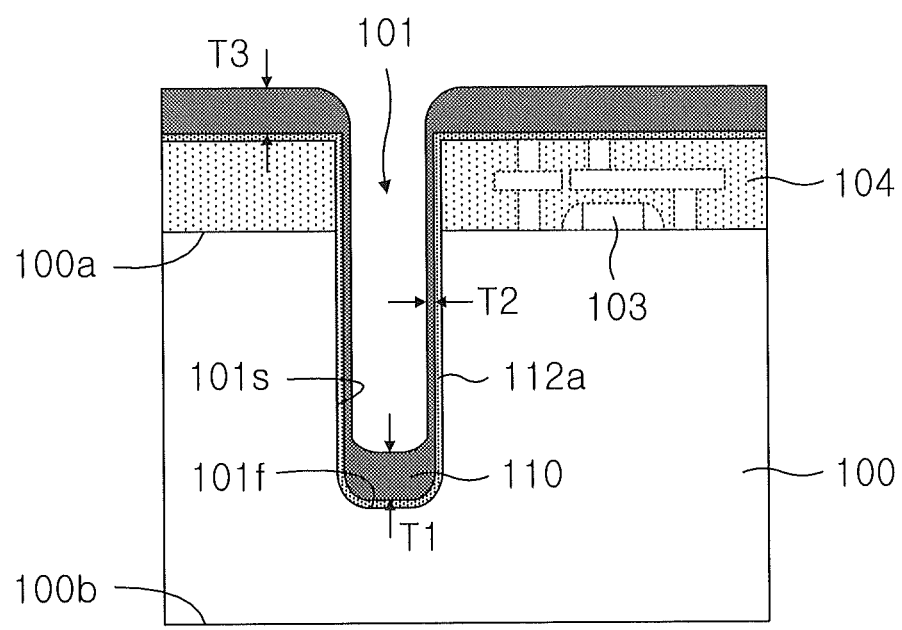
FIGS. 5A and 5B are cross-sectional views illustrating a method for fabricating a semiconductor device according to other embodiments of the inventive concept.
Figure 5B:
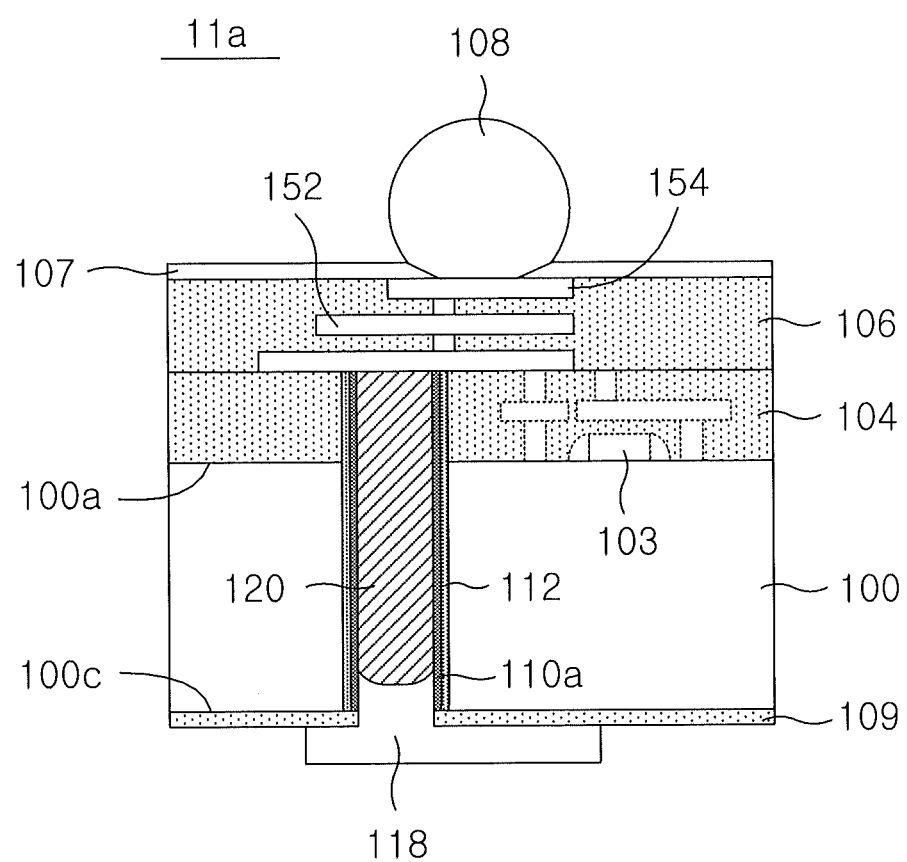

In a modified example, as illustrated in FIG. 5B, an electrical connection part 11a may further include a second via-insulating layer 112 which surrounds the via-insulating layer 110a and extends to the non-active surface 100c of the substrate 100. The second via-insulating layer 112 may be a silicon oxide layer or a silicon nitride layer formed by a chemical vapor deposition (CVD) method.

Figure 6A:
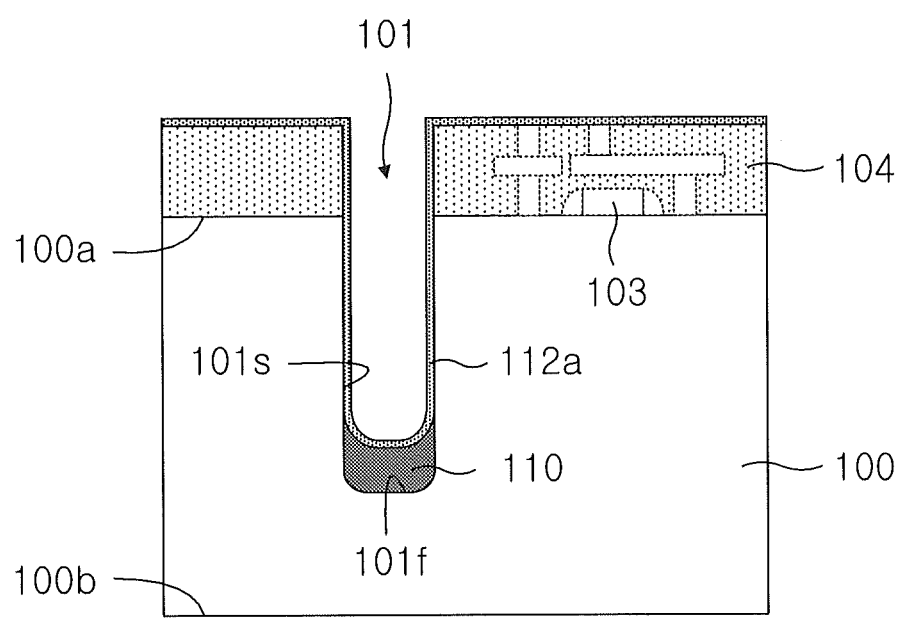
FIGS. 6A to 6E are cross-sectional views illustrating a method for fabricating a semiconductor device according to still other embodiments of the inventive concept.
Figure 6B:
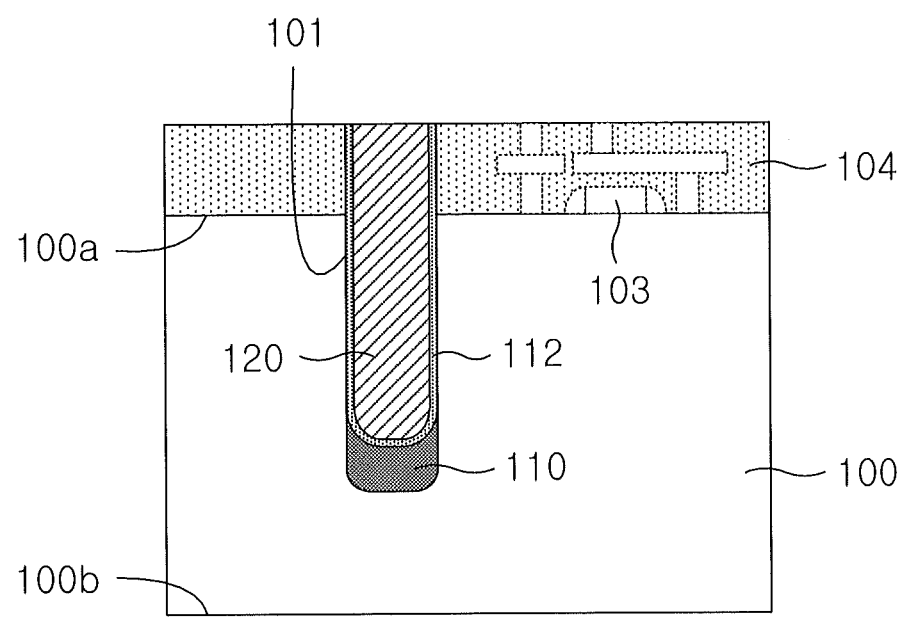
Figure 6C:
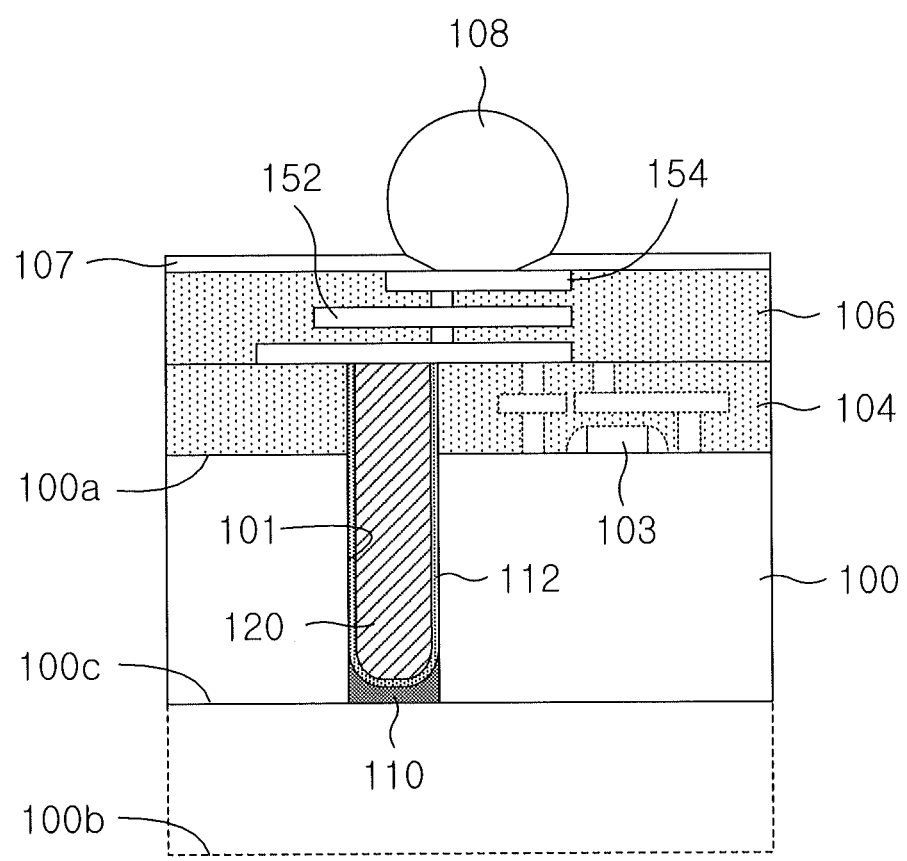
Figure 6D:
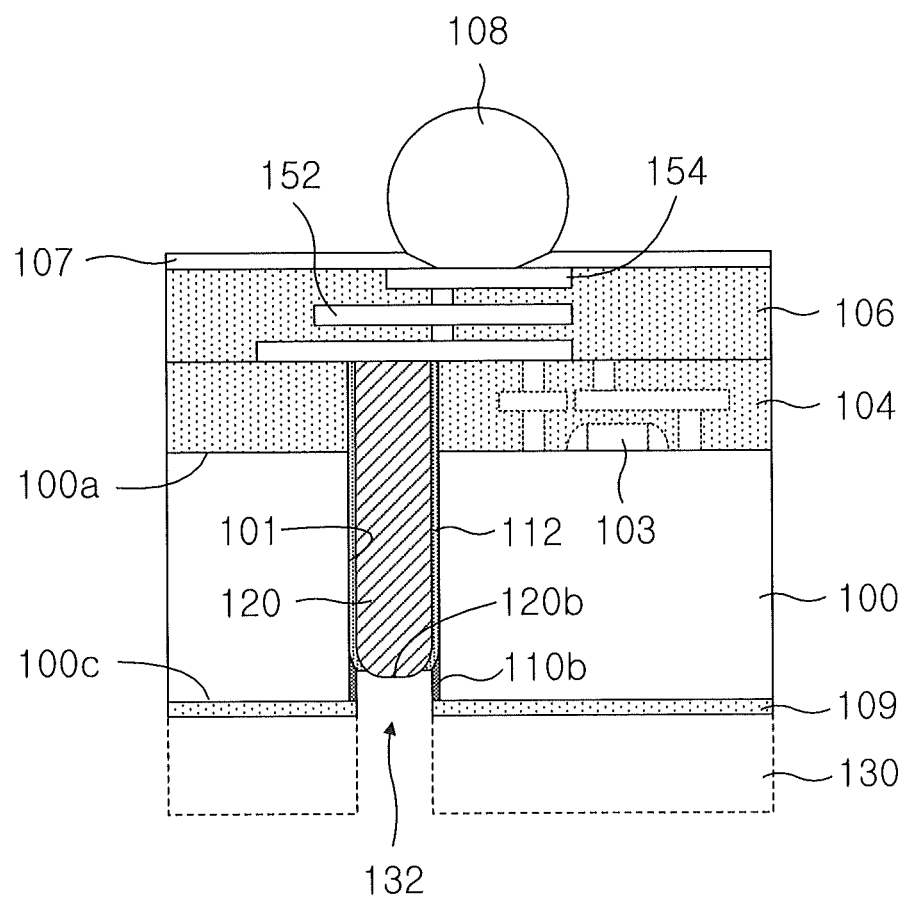
Figure 6E:
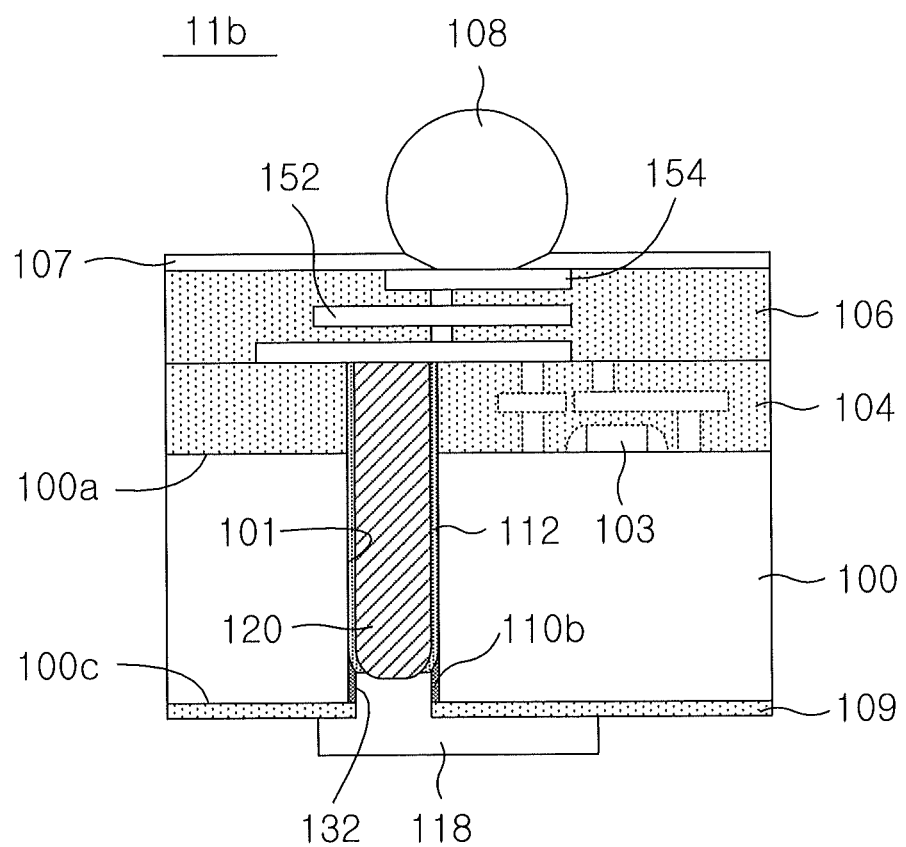

In another modified example, as illustrated in FIG. 6E, an electrical connection part 11b may include a via-insulating layer 112 and a residual sacrificial layer 110b. The via-insulating layer 112 may surround the sidewall of the recessed through-via 120 and be formed by a CVD method. The residual sacrificial layer 110b may extend from the via-insulating layer 112 to the non-active surface 100c of the substrate 100. The residual sacrificial layer 110b may be a silicon oxide layer formed by an FCVD method.

Figure 7A:
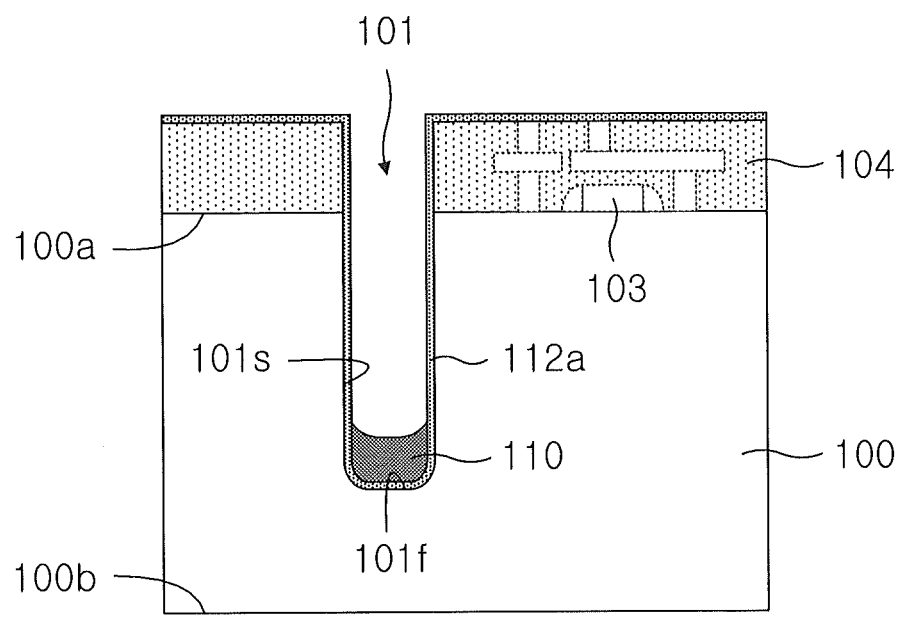
FIGS. 7A to 7E are cross-sectional views illustrating a method for fabricating a semiconductor device according to other embodiments of the inventive concept.
Figure 7B:
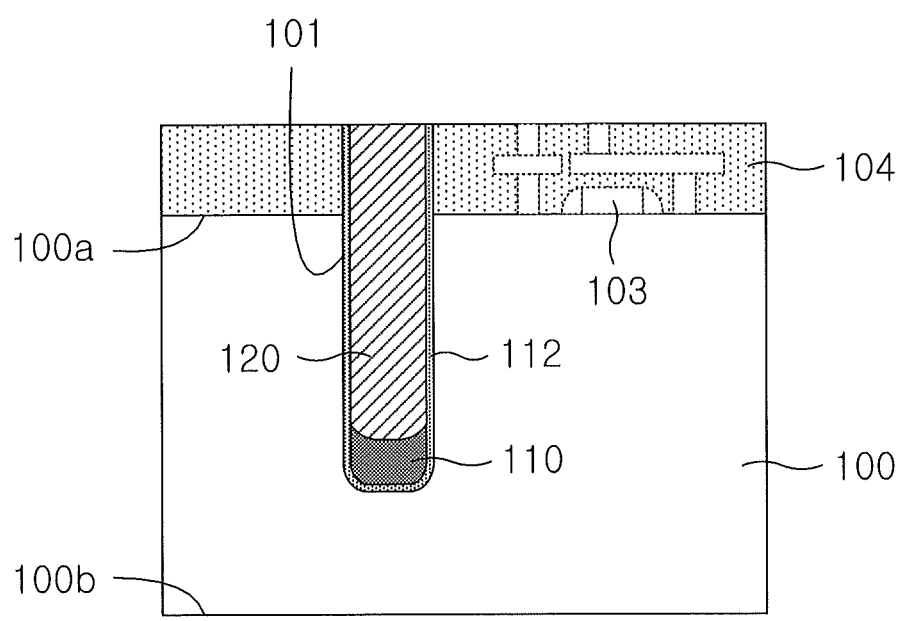
Figure 7C:
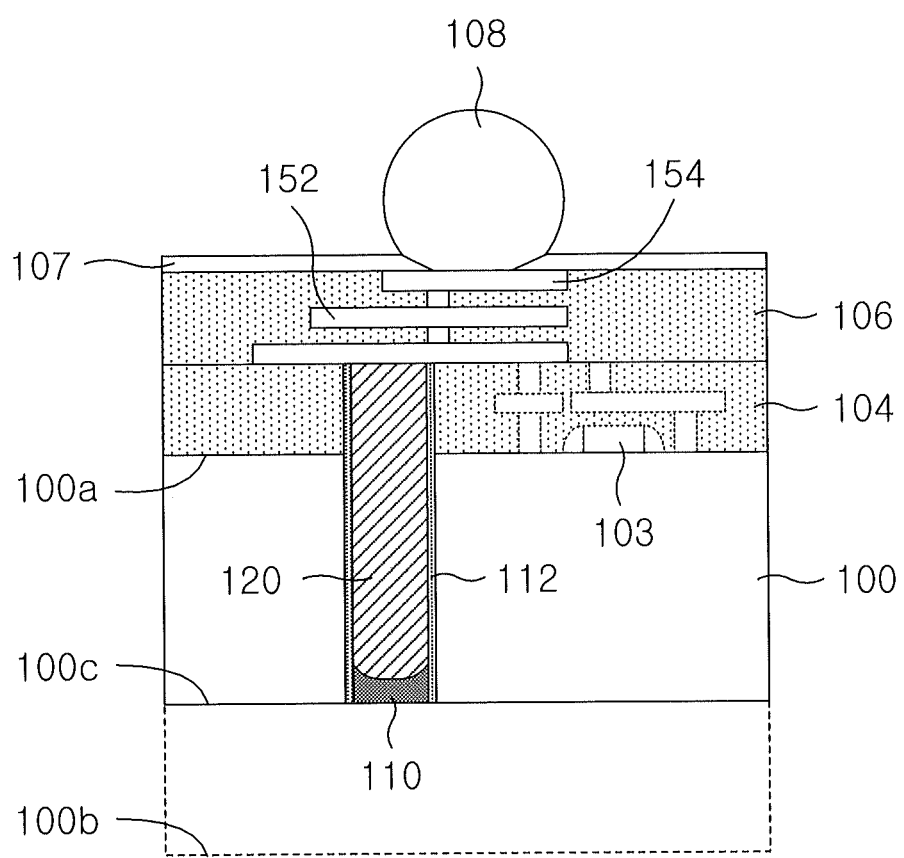
Figure 7D:
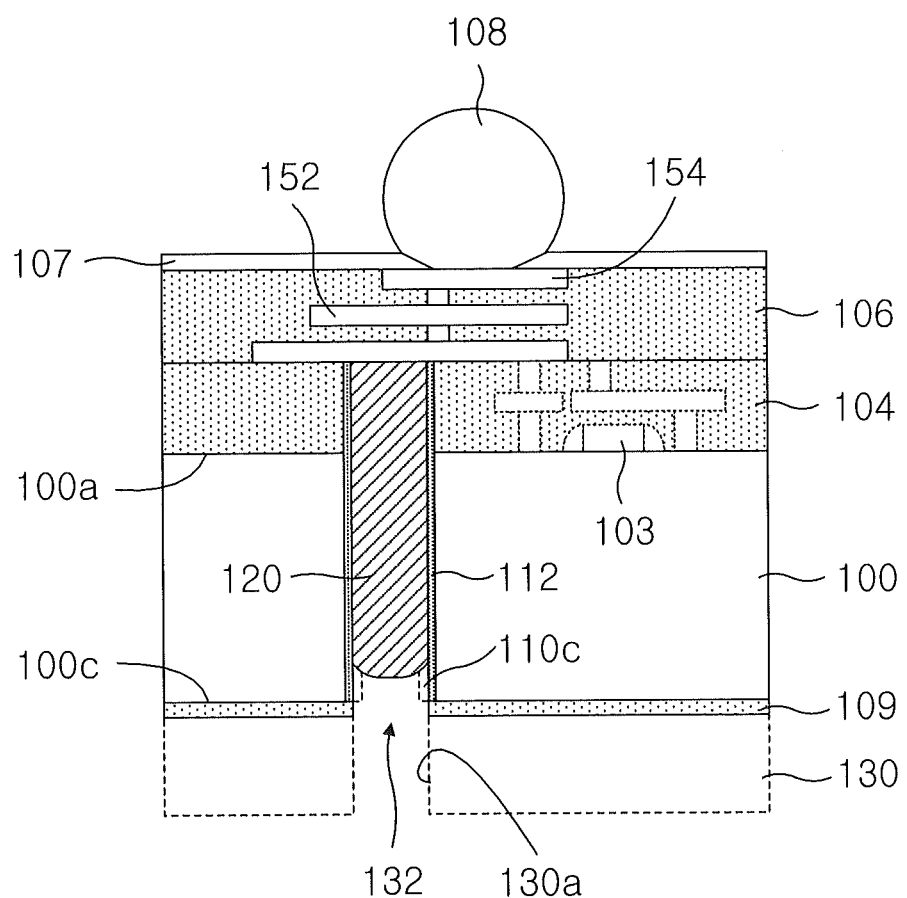
Figure 7E:
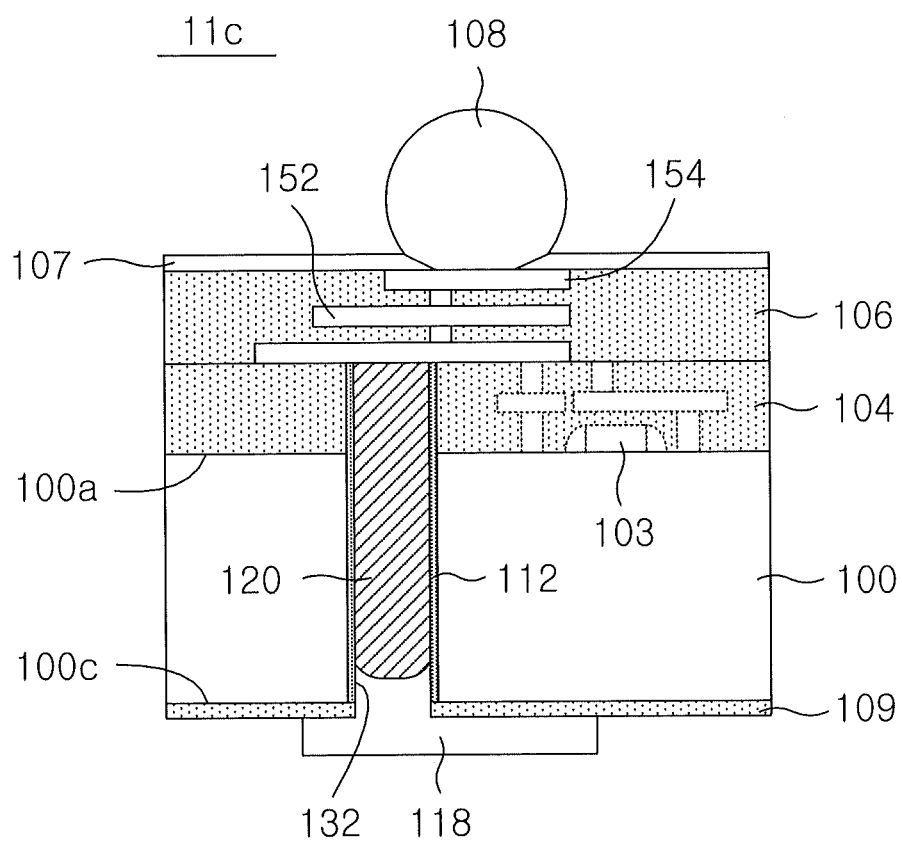

In still another modified example, as illustrated in FIG. 7E, an electrical connection part 11c may include a via-insulating layer 112 that may extend along the sidewall of the recessed through-via 120 to reach the non-active surface 100c of the substrate 100. The via-insulating layer 112 may be a silicon oxide layer or a silicon nitride layer formed by a CVD method.

Figure 8A:
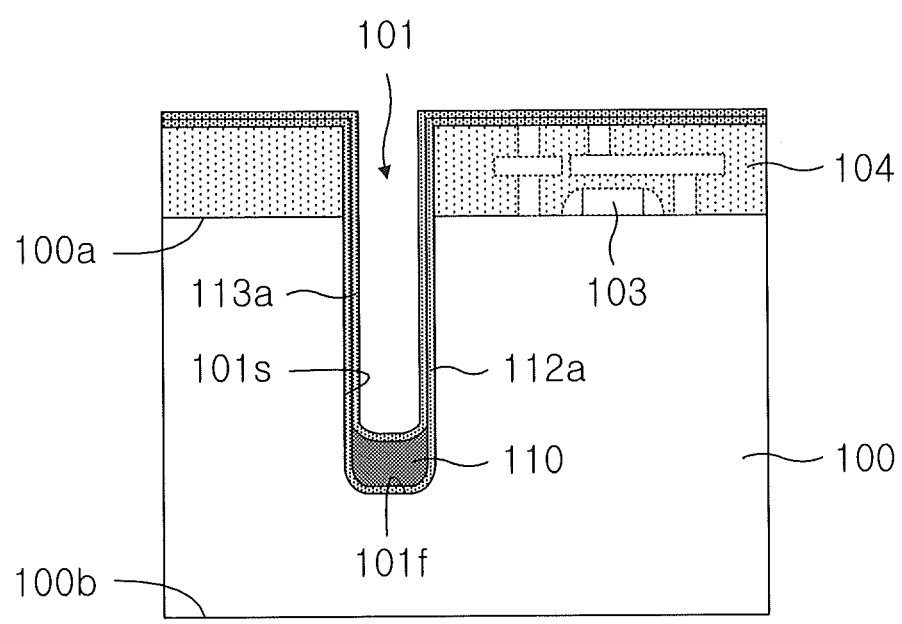
FIGS. 8A and 8B are cross-sectional views illustrating a method for fabricating a semiconductor device according to yet other embodiments of the inventive concept.
Figure 8B:
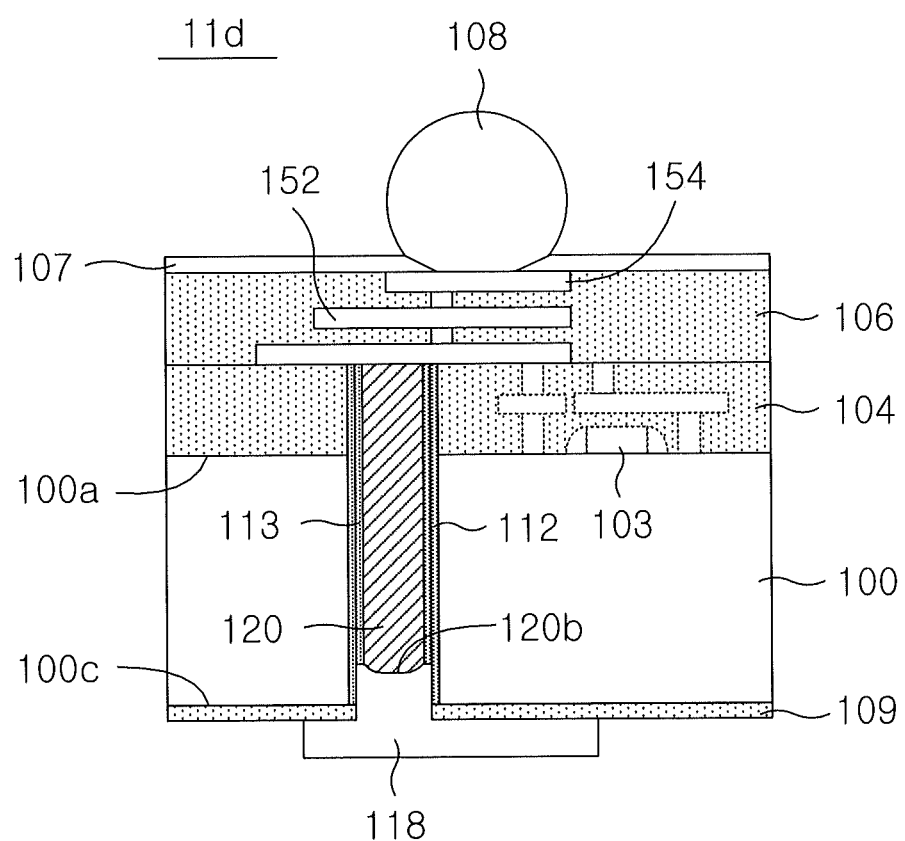

In yet another modified example, as illustrated in FIG. 8B, an electrical connection part 11d may include a via-insulating layer 112 and a second via-insulating layer 113. The second via-insulating layer 113 may surround the through-via 120 and the via-insulating layer 112 may surround the second via-insulating layer 113 and the through-via 120. The via-insulating layer 112 may extend along the sidewall of the through-via 120 to reach the non-active surface 100c of the substrate 100. The second via-insulating layer 113 may extend along the sidewall of the through-via 120 not to reach the non-active surface 100c of the substrate 100. Each of the via-insulating layer 112 and the second via-insulating layer 113 may be a silicon oxide layer or a silicon nitride layer formed by a CVD method.

Figure 2B:
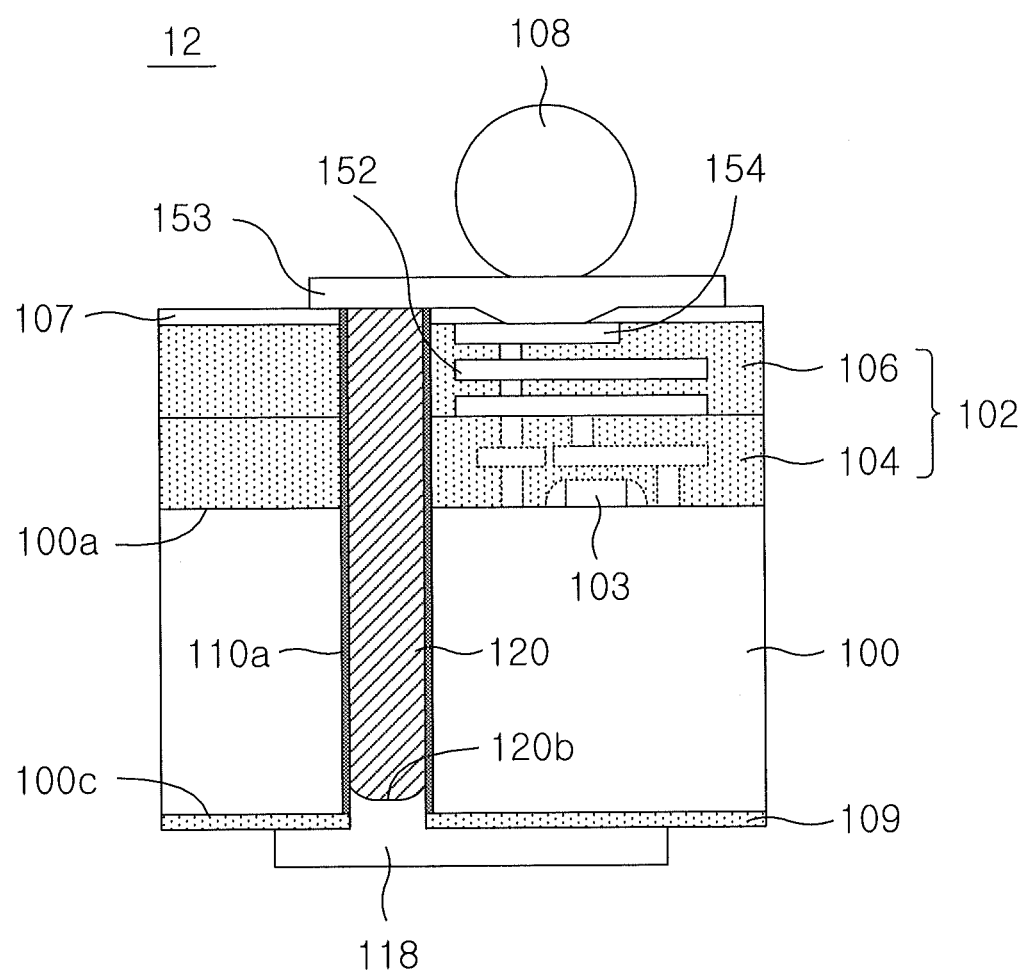

Referring to FIG. 2B, an electrical connection part 12 may have a via-last structure. In the via-last structure, the through-via 120 may be formed after the integrated circuit 103 and the metal interconnection 152 are formed. The through-via 120 may have a recessed pillar shape successively penetrating the second interlayer insulating layer 106, the first interlayer insulating layer 104 and a portion of the substrate 100. The bottom end 120b of the through-via 120 may be disposed at a level higher than the non-active surface 100c of the substrate 100. An upper interconnection 153 may be further provided on the upper insulating layer 107. The upper interconnection 153 may electrically connect the bonding pad 154 to the through-via 120. The through-via 120 may further penetrate the upper insulating layer 107 so as to be connected to the upper interconnection 153.

Figure 2C:
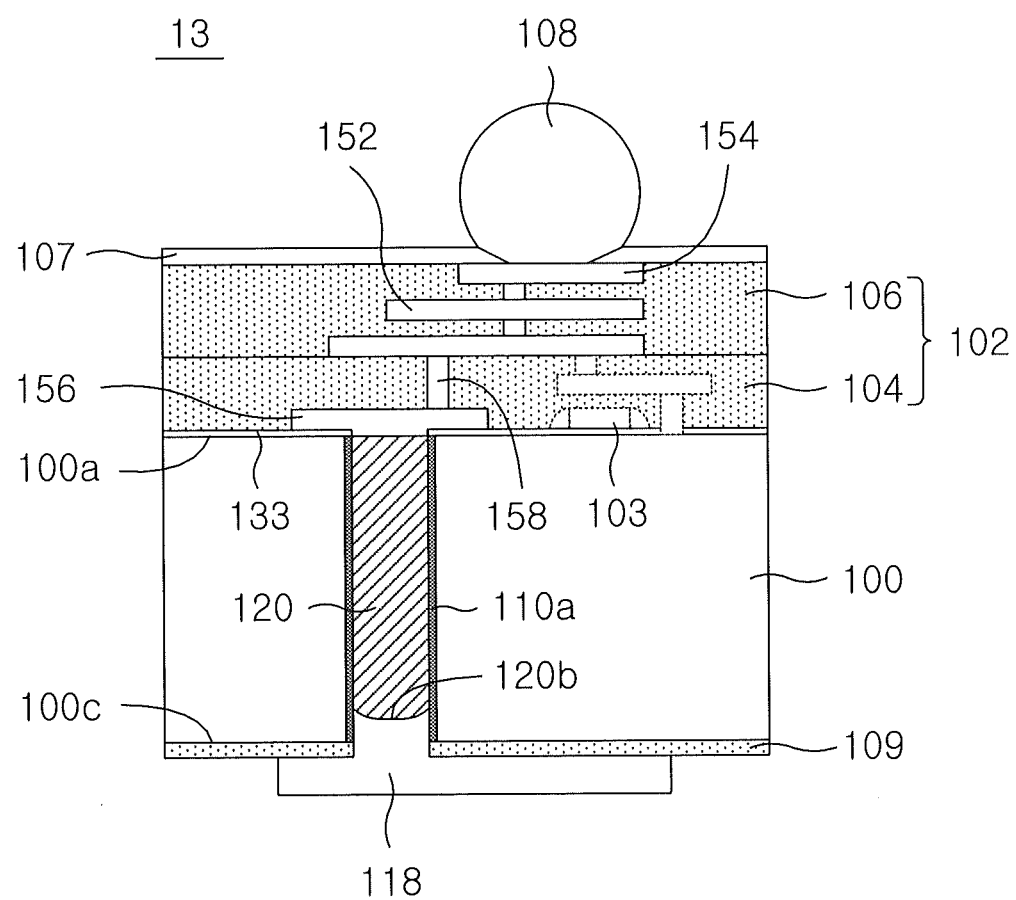

Referring to FIG. 2C, an electrical connection part 13 may have a via-first structure. In the via-first structure, after the through-via 120 is formed, the integrated circuit 103 and the metal interconnection 152 may be sequentially formed. A connecting interconnection 156 may further be formed on the active surface 100a of the substrate 100 with an insulating layer 133 therebetween. The through-via 120 may be electrically connected to the metal interconnection 152 and/or the integrated circuit 103 through a via 158 electrically connecting the connecting interconnection 156 to the metal interconnection 152. The through-via 120 may have a recessed pillar shape penetrating a portion of the substrate 100. The bottom end 120b of the through-via 120 may be disposed at a level higher than the non-active surface 100c of the substrate 100.

Figure 2D:
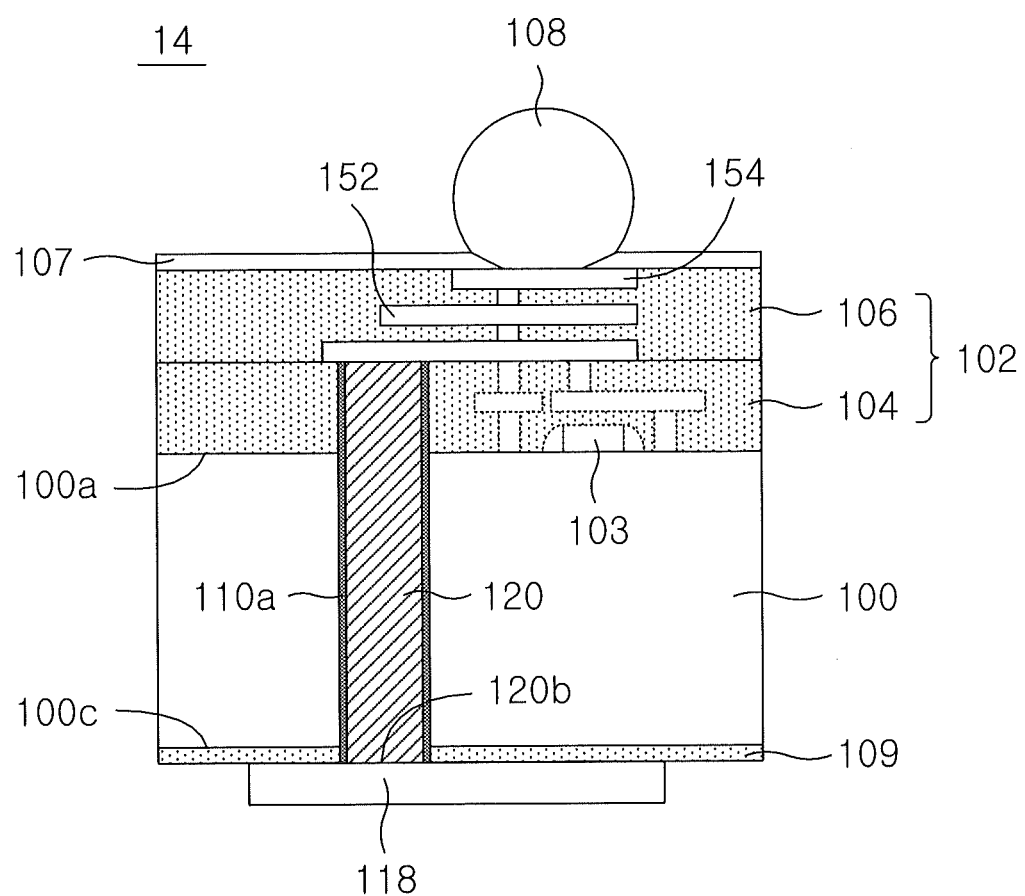

Referring to FIG. 2D, an electrical connection part 14 may include the through-via 120 of which the bottom end 120b is protruded outward from the non-active surface 100c of the substrate 100. A lower sidewall of the protruded through-via 120 may be surrounded by a via-insulating layer 110a and the lower insulating layer 109. The electrical connection part 14 may have the via-middle structure in the present embodiment. However, the inventive concept is not limited thereto. The electrical connection part 14 may have the via-last structure or the via-first structure described above.

Figure 3:
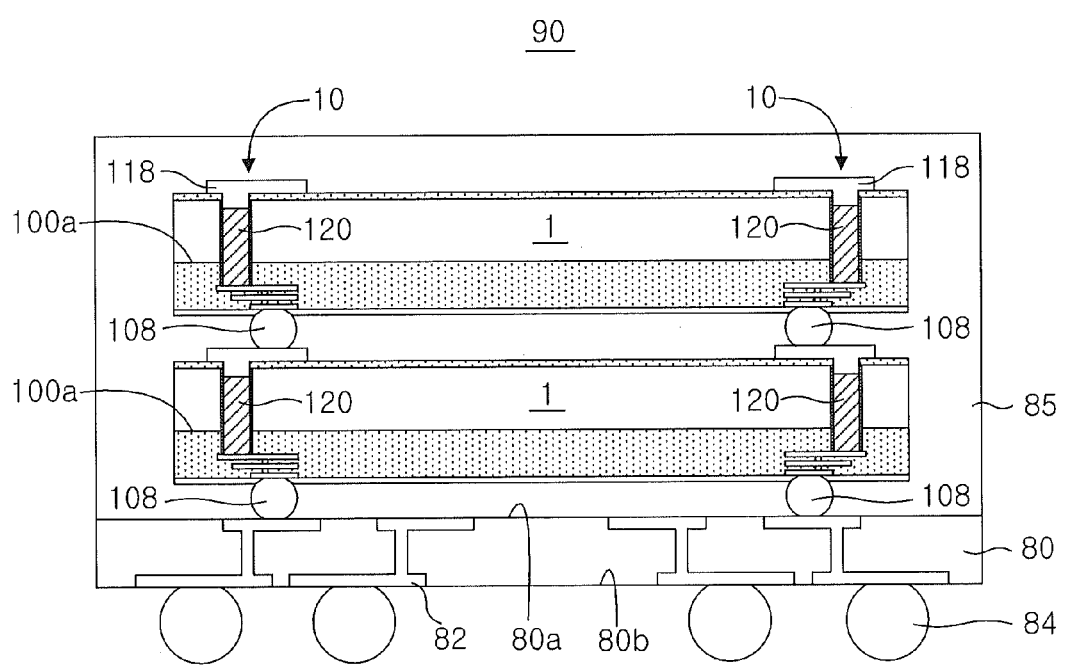
FIG. 3 is a cross-sectional view illustrating a semiconductor package including a semiconductor device according to embodiments of the inventive concept.

FIG. 3 is a cross-sectional view illustrating a semiconductor package including a semiconductor device according to embodiments of the inventive concept.

Referring to FIG. 3, a semiconductor package 90 may include a package substrate 80 and one or more semiconductor devices 1 of FIG. 1 mounted on the package substrate 80. The semiconductor package 90 may further include a molding layer 85 molding the semiconductor devices 1. The package substrate 80 may include a top surface 80a and a bottom surface 80b opposite to the top surface 80a. The package substrate 80 may be a printed circuit board (PCB) in which an electrical connecting interconnections 82 are included. The semiconductor devices 1 may be mounted on the top surface 80a of the package substrate 80 in a face down state that active surfaces 100a of the semiconductor devices 1 face the package substrate 80. In other embodiments, the semiconductor devices 1 may be mounted on the top surface 80a of the package substrate 80 in a face up state. The semiconductor package 90 may further include one or more solder balls 84 which are adhered to the bottom surface 80b of the package substrate 80 and are connected to the electrical connecting interconnection 82. In the present embodiment, electrical connection between the semiconductor devices 1 and between the semiconductor devices 1 and the package substrate 80 may be realized by the through-vias 120. The electrical connection parts 10 of the semiconductor devices 1 may be replaced with one of all the electrical connection parts described throughout the present specification.

FIGS. 4A to 4M are cross-sectional views illustrating a method for fabricating a semiconductor device according to some embodiments of the inventive concept. FIGS. 4J to 4L are enlarged views of a portion of FIG. 4I. FIGS. 5A and 5B are cross-sectional views illustrating a method for fabricating a semiconductor device according to other embodiments of the inventive concept. FIG. 5A is a modified example of FIG. 4A and FIG. 5B is a modified example of FIG. 4M.

Figure 4A:
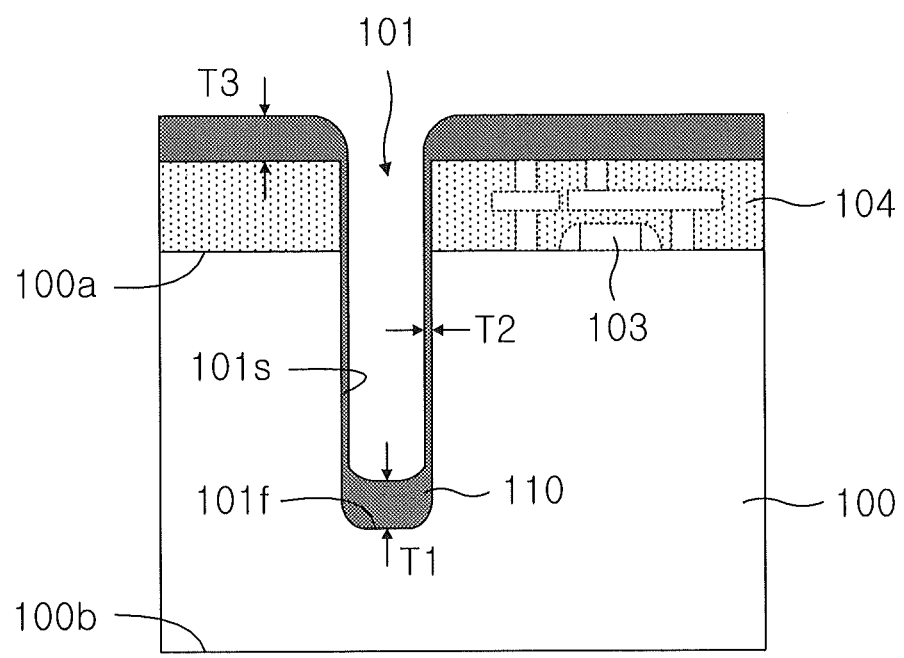
FIGS. 4A to 4M are cross-sectional views illustrating a method for fabricating a semiconductor device according to some embodiments of the inventive concept.

Referring to FIG. 4A, a via-hole 101 may be formed in a substrate 100 and then a sacrificial layer 110 may be formed on the substrate 100. The substrate 100 may include a semiconductor substrate (e.g., a silicon substrate) having a top surface 100a and a first bottom surface 100b opposite to the top surface 100a. An integrated circuit 103 may be formed on the top surface 100a. A first interlayer insulating layer 104 covering the integrated circuit 103 may be formed on the top surface 100a of the substrate 100. The integrated circuit 103 may include a memory circuit, a logic circuit, or combination thereof. The first interlayer insulating layer 104 may be a silicon oxide layer and/or a silicon nitride layer. The via-hole 101 may be formed to have a hollow pillar-shape which is opened toward the top surface 100a of the substrate 100 and has a depth not reaching the first bottom surface 100b. The via-hole 101 may substantially vertically penetrate the substrate 100 by dry-etching or drilling the first interlayer insulating layer 104 and substrate 100 which correspond to a region (e.g., a scribe lane or a region adjacent thereto) around the integrated circuit 103 or a region in which the integrated circuit 103 is formed.

The sacrificial layer 110 may be formed of an insulating material which is deposited by a spin coating method, a spray coating method, a spin-on-glass (SOG) method, or a flowable chemical vapor deposition (FCVD) method. In the present embodiment, the sacrificial layer 110 may be an FCVD layer formed by the FCVD method. Performing the FCVD method may include providing a silicon containing compound (e.g., organo-silane or organo-siloxane) and an oxidizing agent (e.g., ethanol or isopropyl alcohol) to the substrate 100, condensing the silicon containing compound and the oxidizing agent to deposit a flowable layer having Si—O, Si—H, and/or Si—OH combination, and converting the flowable layer to a solid phase silicon oxide layer (e.g., $SiO_2$).

Depositing the flowable layer may be performed at a low temperature (e.g., within a range of about 20 degrees Celsius to about 150 degrees Celsius) under a low pressure (e.g., within a range of about 1 Torr to about 100 Torr) without plasma. Converting the flowable layer to the silicon oxide layer may be performed in plasma environment (e.g., oxygen, helium, and/or argon plasma) at a temperature of about 200 degrees Celsius or more at a low pressure (e.g., less than about 10 Torr). Alternatively, converting the flowable layer to the silicon oxide layer may be performed by an annealing treatment. The flowable layer may be solidified and be constricted by the plasma or the annealing treatment, such that the sacrificial layer 110 (e.g., a silicon oxide layer) may be formed.

A thickness and/or a shape of the sacrificial layer 110 may be changed according to the process conditions. For example, the sacrificial layer 110 may be formed by depositing a silicon oxide layer which has a thick thickness T1 on a bottom surface 101f of the via-hole 101 and a thin thickness T2 on an inner sidewall 101s of the via-hole 101 (T2<T1). The sacrificial layer 110 may have a thick thickness T3 on the top surface 100a of the substrate 100. The thickness T3 may be substantially equal to the thickness T2. Alternatively, one of the thickness T3 and the thickness T2 may be greater than the other of the thickness T3 and the thickness T2.

In other embodiments, as illustrated in FIG. 5A, an insulating layer 112a may further be formed to extend along the inner sidewall 101s and the bottom surface 101f of the via-hole 101 before the sacrificial layer 110 is formed. The insulating layer 112a may be formed by depositing a silicon oxide layer or a silicon nitride layer using a CVD process (e.g., a plasma enhanced CVD (PECVD) process). The insulating layer 112a may have a thickness thinner than the thickness T1 of the sacrificial layer 110 formed on the bottom surface 101f of the via-hole 101.

Figure 4B:
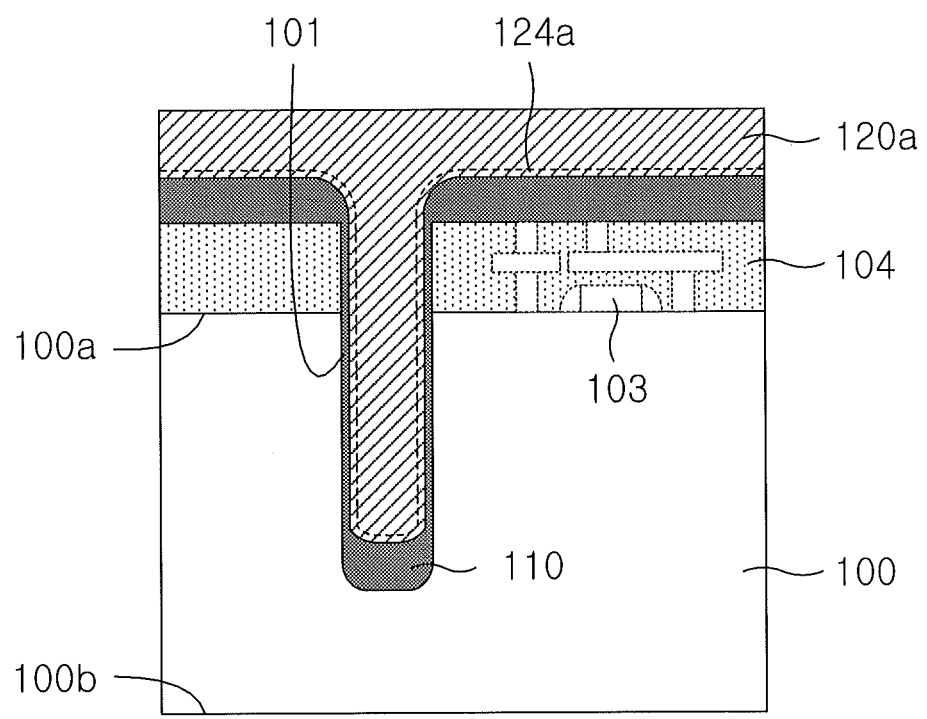

Referring to FIG. 4B, a conductive layer 120a may be formed on the substrate 100, so that the via-hole 101 is filled with the conductive layer 120a. In some embodiments, a metal layer 124a may further be formed on the substrate 100 before the conductive layer 120a is formed. The conductive layer 120a may include at least one of silicon, copper, tungsten, and aluminum. The conductive layer 120a may be formed by a deposition process or a plating process. If the conductive layer 120a includes copper, the metal layer 124a may include titanium (Ti), chromium (Cr), tantalum (Ta), nickel (Ni), or any combination thereof which may prevent copper of the metal layer 124a from being diffused. The metal layer 124a may be formed by a deposition process. If the conductive layer 120a is formed using the plating process, a seed layer may further be formed on the substrate 100 before the conductive layer 120a is formed.

Figure 4C:
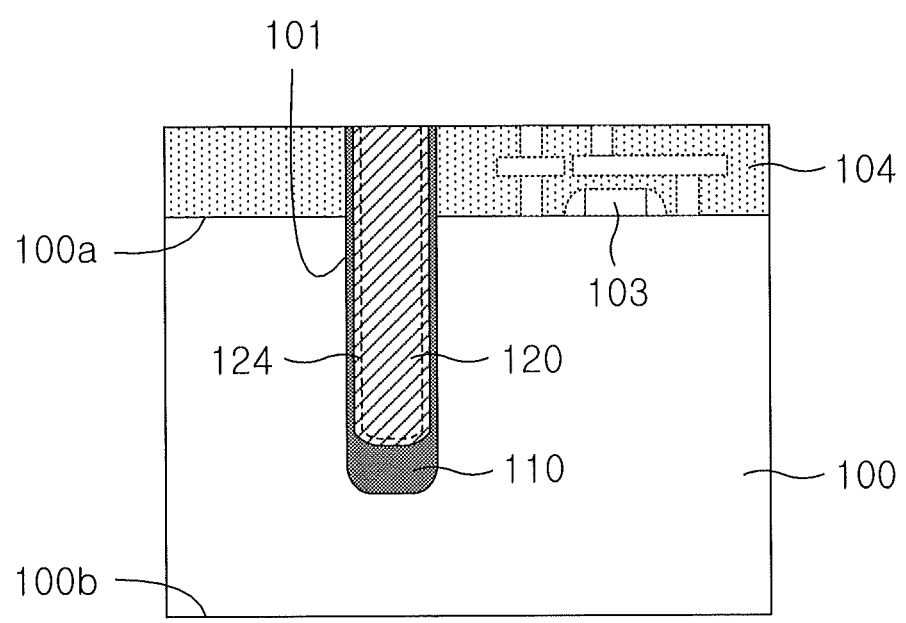

Referring to FIG. 4C, the conductive layer 120a and the sacrificial layer 110 may be planarized to expose the first interlayer insulating layer 104. The planarization may be performed by an etch-back process or a chemical mechanical polishing (CMP) process. The conductive layer 120a may be formed into a through-via 120 having a vertically extending pillar-shape by the planarization. If the metal layer 124a is formed, the metal layer 124a may be formed into a barrier layer 124 by the planarization. The barrier layer 124 may prevent an element (e.g., copper) of the through-via 120 from being diffused into the substrate 100 or the integrated circuit 103. For brevity of the drawings, the barrier layer 124 will be omitted hereinafter.

Figure 4D:
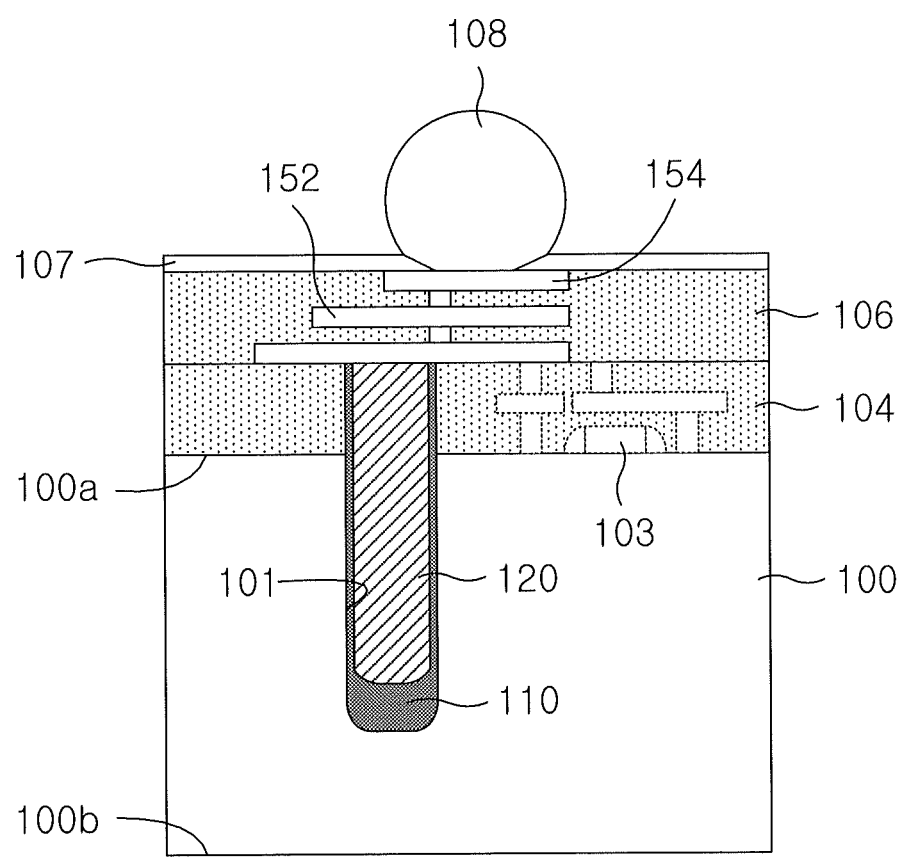

Referring to FIG. 4D, a back-end process may be performed. In some embodiments, a metal interconnection 152, a bonding pad 154, and a second interlayer insulating layer 106 may be formed on the first interlayer insulating layer 104. The metal interconnection 152 may be connected to the through-via 120 and have a single-layered structure or a multi-layered structure. The bonding pad 154 may be electrically connected to the metal interconnection 152. The second interlayer insulating layer 106 may cover the metal interconnection 152 and the bonding pad 154. The metal interconnection 152 and the bonding pad 154 may be formed by a process depositing a metal such as copper or aluminum and a process patterning the metal. The second interlayer insulating layer 106 may be formed by a process depositing the same insulator as or a similar insulator to the first interlayer insulating layer 104. For example, the second interlayer insulating layer 106 may be formed of a silicon oxide layer or a silicon nitride layer. An upper insulating layer 107 may be formed on the second interlayer insulating layer 106. The upper insulating layer 107 may be formed by depositing a silicon oxide layer, a silicon nitride layer, or a polymer. The upper insulating layer 107 may be formed to expose the bonding pad 154. Additionally, a bump process may further be performed to form an upper terminal 108 (e.g., a solder ball or a solder bump) connected to the bonding pad 154.

Figure 4E:
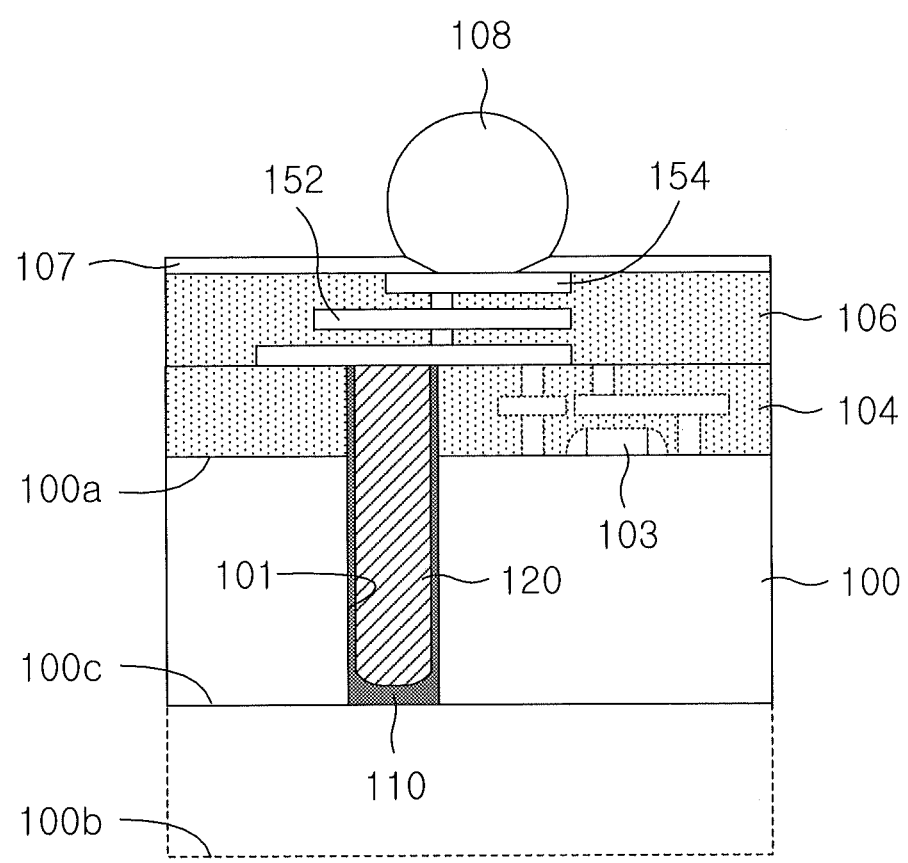

Referring to FIG. 4E, the substrate 100 may be recessed. For example, the first bottom surface 100b of the substrate 100 may be chemical-mechanical polished, etched, or grinded to expose a second bottom surface 100c which does not protrude the through-via 120. The sacrificial layer 110 may be partially recessed while the substrate 100 is recessed. The top surface 100a of the substrate 100 may be an active surface and the second bottom surface 100c of the substrate 100 may be a non-active surface.

Figure 4F:
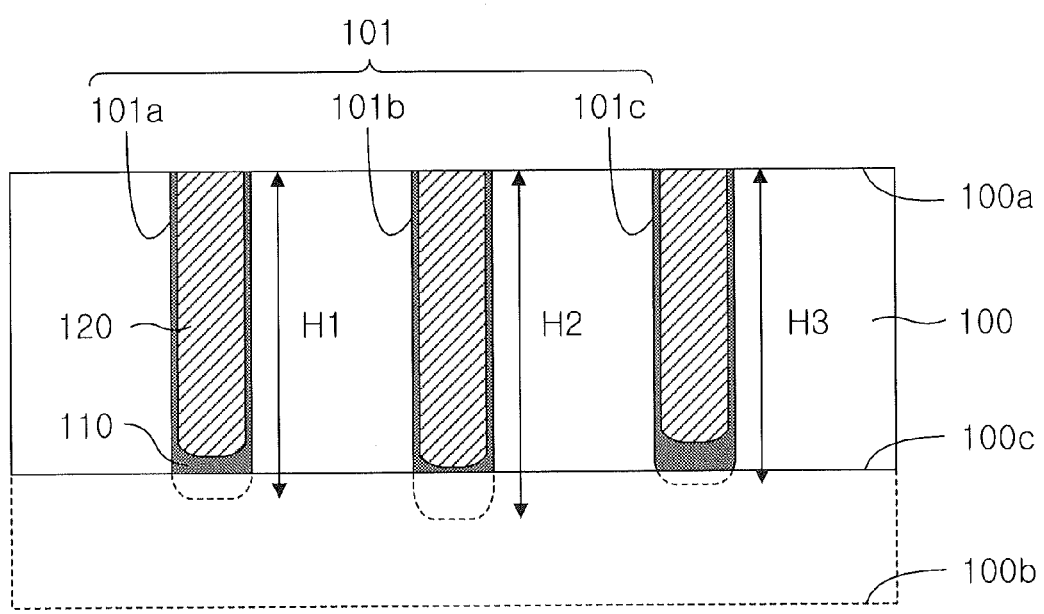

According to the present embodiment, even though depths of the via-holes 101 in the substrate 100 are different from each other or removing amounts in regions of the substrate 100 are different from each other, the sacrificial layer 110 may prevent the through-vias 120 from being exposed. For example, as illustrated in FIG. 4F, the via-holes 101 may include a first via-hole 101a, a second via-hole 101b, and a third via-hole 101c. The second via-hole 101b may have a depth H2 greater than a depth H1 of the first via-hole 101a, and the third via-hole 101c may have a depth H3 smaller than the depth H1 of the first via-hole 101a. In this case, the through-via 120 in the second via-hole 101b may be exposed when the substrate 100 is recessed.

Figure 4G:
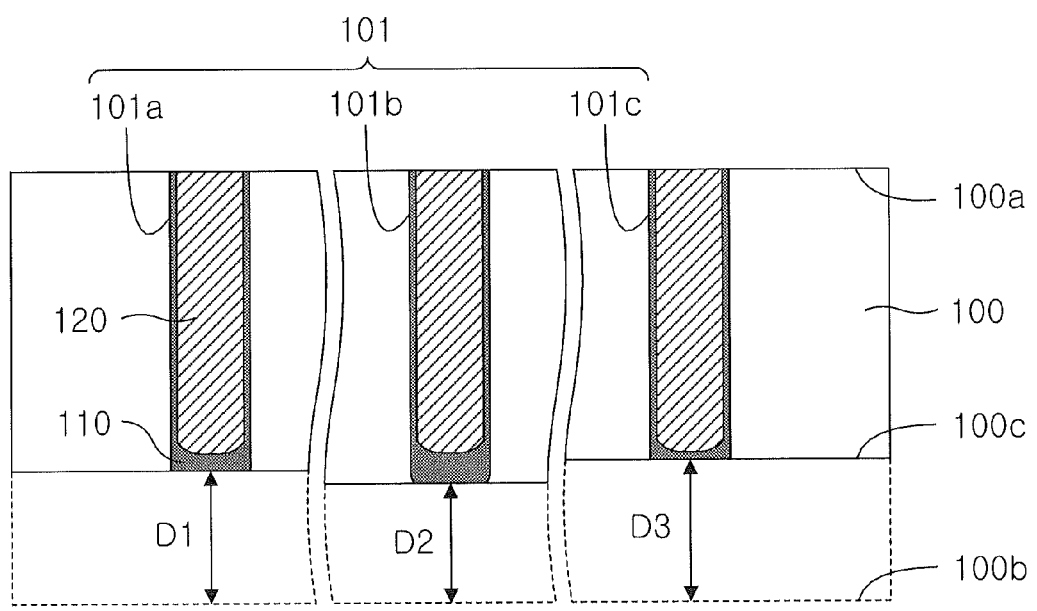

Alternatively, as illustrated in FIG. 4G, the removing amounts D1, D2, and D3 under the first to third via-holes 101a, 101b, and 101c may be different from each other (D2<D1<D3), a level-difference of the second bottom surface 100c may occur. The through-via 120 in the third via-hole 101c may be exposed by the level-difference of the second bottom surface 100c. However, in the present embodiment, the sacrificial layer 110 may be relatively thick under the through-via 120 as described with reference to FIG. 4A. Thus, it is possible to prevent the through-via 120 from being exposed. Additionally, the relatively thick sacrificial layer 110 under the through-via 120 may sufficiently secure an etching margin, and the substrate 100 may be recessed by not a CMP process but the etching process.

Figure 4H:
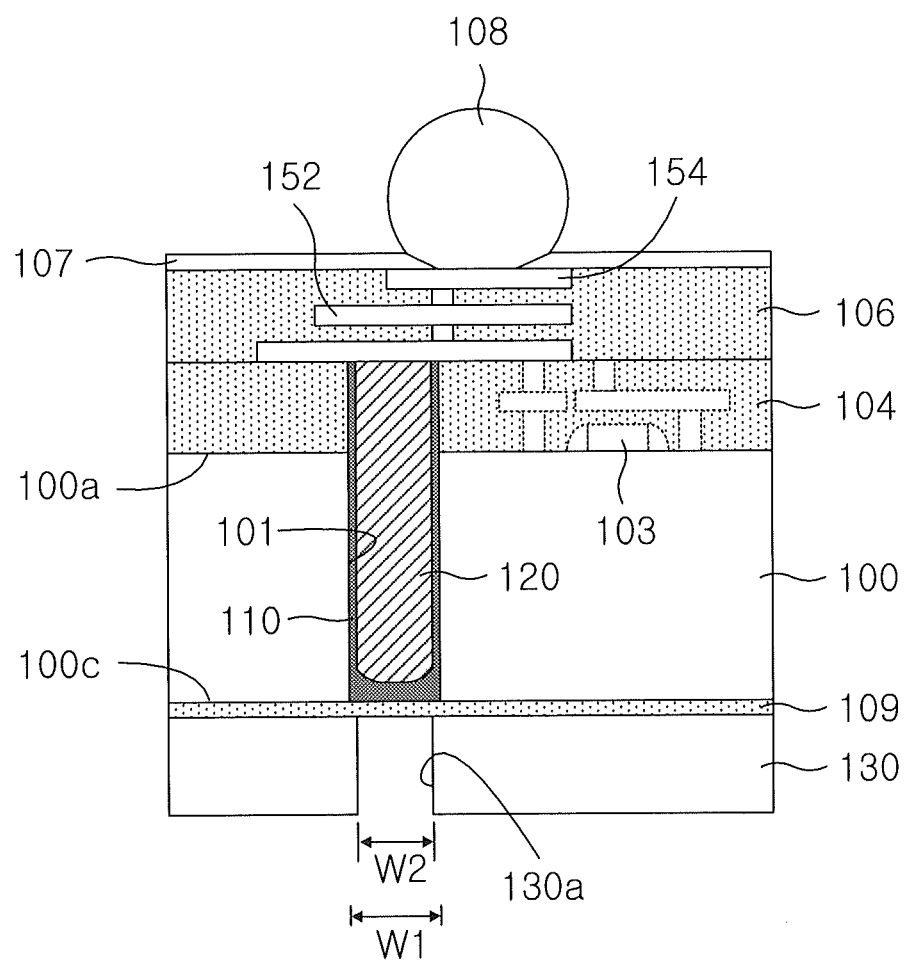

Referring to FIG. 4H, a lower insulating layer 109 may be formed on the second bottom surface 100c of the substrate 100 and then a mask 130 may be formed on the lower insulating layer 109. The lower insulating layer 109 may be formed by depositing a silicon oxide layer, a silicon nitride layer, or a polymer layer. The mask 130 may be formed by a process coating a photoresist and a process patterning the photoresist. The mask 130 may include an opening pattern 130a vertically aligned with the via-hole 101. The opening pattern 130a may have a width W2 smaller than a width W1 of the via-hole 101. A shape of the opening pattern 130a may be the same as or similar to the shape of the via-hole 101. For example, the opening pattern 130a may have a hollow pillar-shape.

Figure 4I:
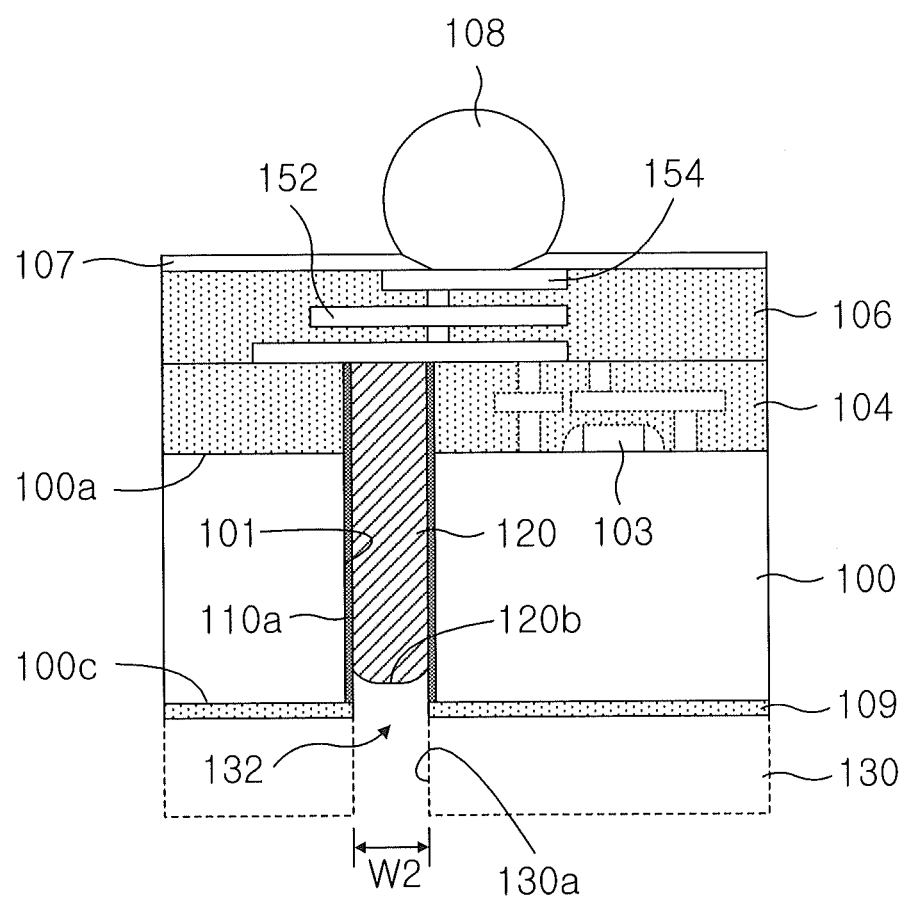
Figure 4J:
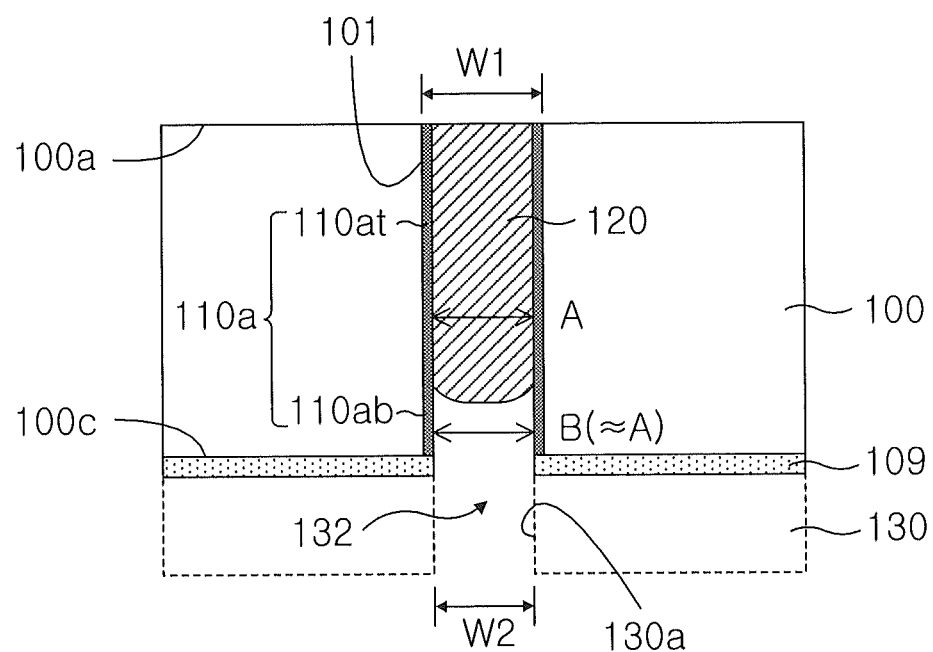
Figure 4K:
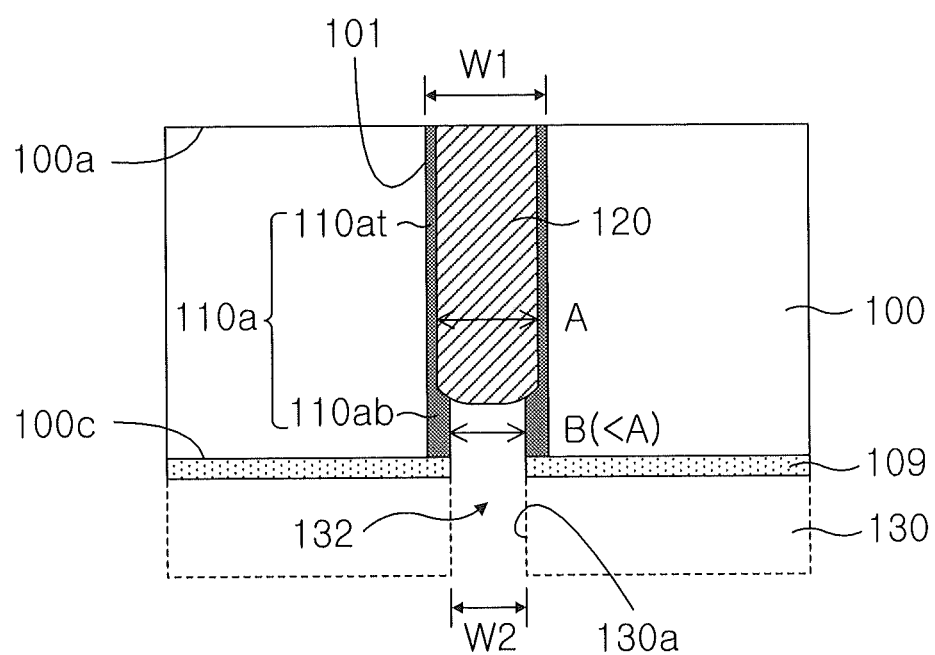
Figure 4L:
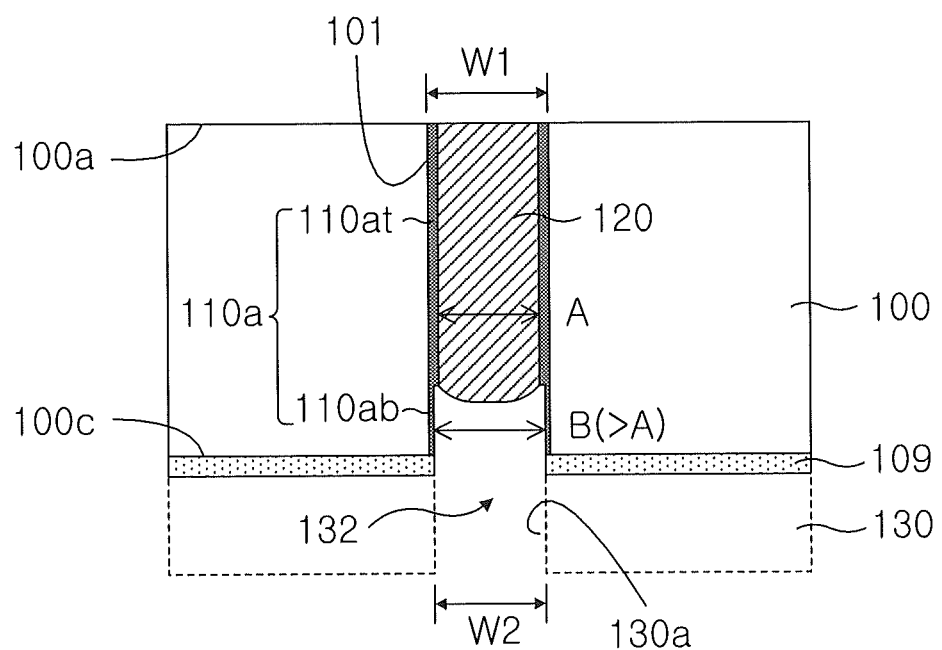

Referring to FIG. 4I, the lower insulating layer 109 and the sacrificial layer 110 may be selectively removed by an etching process using the mask 130 as an etch mask. By the etching process, an opening 132 may be formed to expose the bottom end 120b of the through-via 120 which is disposed at a level higher than the second bottom surface 100c of the substrate 100. A residual sacrificial layer 110a may extend to the second bottom surface 100c of the substrate 100. An inner sidewall of the opening 132 may include the residual sacrificial layer 110a, such that the substrate 100 may not be exposed through the opening 132. Additionally, even though a portion of the bottom end 120b of the through-via 120 is removed during the formation of the opening 132, the residual sacrificial layer 110a may prevent the removed portion of the through-via 120 from being in contact with the substrate 100. Since the residual sacrificial layer 110a surrounds the through-via 120, the residual sacrificial layer 110a may function as a via-insulating layer electrically insulating the through-via 120 from the substrate 100. As a result, a process forming a via-insulating layer may be skipped in the present embodiment. The mask 130 may be removed by an ashing process. A thickness of the residual sacrificial layer 110a and/or a width of the opening 132 may be changed according to the width of the opening pattern 130a of the mask 130.

In some embodiments, as illustrated in FIG. 4J, if the etching process is performed using the mask 130 having the opening pattern 130a of which the width W2 is equal to or similar to a width A of the through-via 120, a thickness of an upper residual sacrificial layer 110 at in contact with the through-via 120 may be equal to or similar to a thickness of a lower residual sacrificial layer 110ab which is not in contact with the through-via 120. The upper residual sacrificial layer 110 at may surround the through-via 120, and the lower residual sacrificial layer 110ab may consist of the inner sidewall of the opening 132. The upper and lower residual sacrificial layer 110 at and 110ab may be included in a residual sacrificial layer 110a. Additionally, the opening 132 may be formed to have a width B equal to or similar to the width A of the through-via 120.

In other embodiments, as illustrated in FIG. 4K, if the etching process is performed using the mask 130 having the opening pattern 130a of which the width W2 is smaller than the width A of the through-via 120, the thickness of the lower residual sacrificial layer 110ab of the residual sacrificial layer 110a may be greater than the thickness of the upper residual sacrificial layer 110 at of the residual sacrificial layer 110a. Additionally, the opening 132 may be formed to have a width B smaller than the width A of the through-via 120.

In still other embodiments, as illustrated in FIG. 4L, if the etching process is performed using the mask 130 having the opening pattern 130a of which the width W2 is greater than the width A of the through-via 120, the thickness of the lower residual sacrificial layer 110ab of the residual sacrificial layer 110a may be smaller than the thickness of the upper residual sacrificial layer 110 at of the residual sacrificial layer 110a. Alternatively, the lower residual sacrificial layer 110ab may be removed. Additionally, the opening 132 may be formed to have a width B greater than the width A of the through-via 120. In this case, the thin thickness of the lower residual sacrificial layer 110ab consisting of the inner sidewall of the opening 132 may not reliably prevent etching damage provided to the substrate 100, and the substrate 100 may be exposed through the opening 132.

According to this embodiment, the lower insulating layer 109 and the sacrificial layer 110 may be selectively removed by the etching process using the mask 130 including the opening pattern 130a which has the width W2 smaller than the width W1 of the via-hole 101 and equal to or greater than the width A of the through-via 120. As a result, as illustrated in FIG. 4J, it may be possible to form the residual sacrificial layer 110a extending along the inner sidewall of the via-hole 101 and having the uniform or similar thickness and the opening 132 having the width B equal or similar to the width A of the through-via 120. Alternatively, as illustrated in FIG. 4K, it may be possible to form the residual sacrificial layer 110a including the thin upper residual sacrificial layer 110 at and the thick lower residual sacrificial layer 110ab and the opening 132 having the width B smaller than the width A of the through-via 120.

Figure 4M:
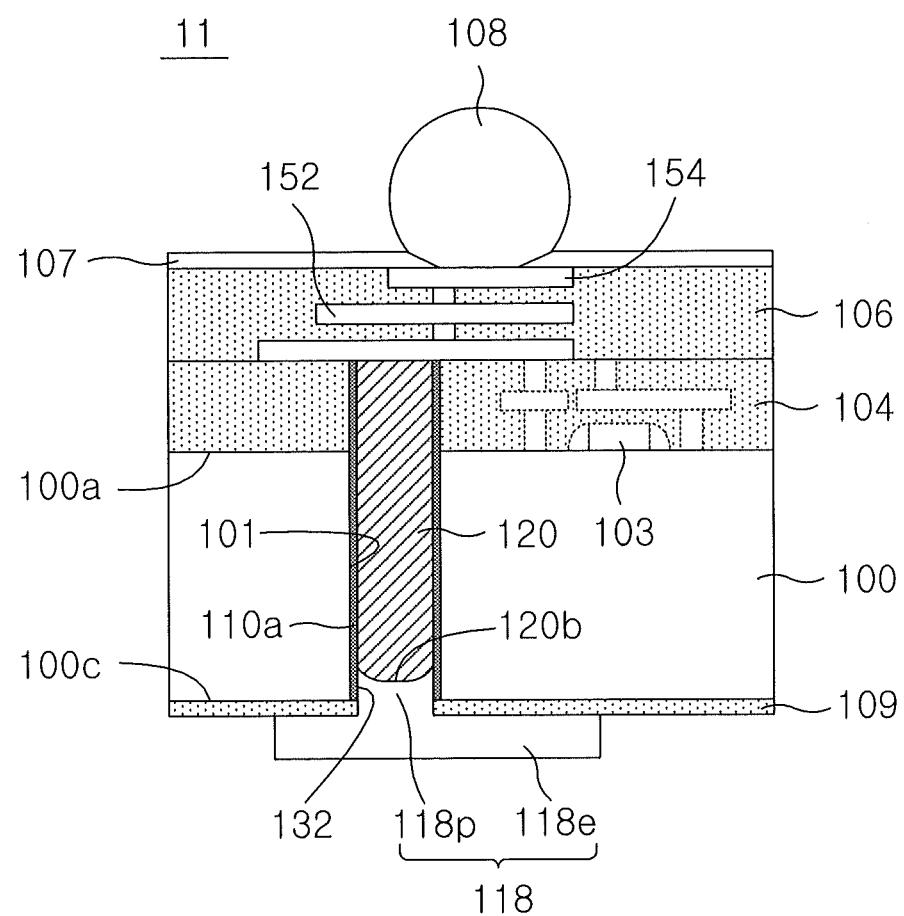

Referring to FIG. 4M, a lower terminal 118 electrically connected to the through-via 120 may be formed on the lower insulating layer 109. The lower terminal 118 may have a pad-shape including a protrusion 118p and an extension 118e. The protrusion 118p may be protruded from the extension 118e to fill the opening 132 and be connected to the bottom end 120b of the through-via 120. The extension 118e may extend along the second bottom surface 100c of the substrate 100. The extension 118e may be re-interconnected. The protrusion 118p may be electrically insulated from the substrate 100 by the residual sacrificial layer 110a. The extension 118e may be electrically insulated from the substrate 100 by the lower insulating layer 109. In other embodiments, the lower terminal 118 may be formed to have a solder ball or a solder bump. As a result, it is possible to form the semiconductor device 1 of FIG. 1 including the electrical connection part 11 of the via-middle structure of FIG. 2A having the recessed through-via 120 by the processes described above.

In other embodiments, if an insulating layer 112a may further be formed as illustrated in FIG. 5A, an electrical connection part 11a further including a via-insulating layer 112 may be formed as illustrated in FIG. 5B. The via-insulating layer 112 may be formed between the substrate 100 and the residual sacrificial layer 110a. In the present embodiment, the through-via 120 may be electrically insulated from the substrate 100 by the double-layer of the residual sacrificial layer 110a and the via-insulating layer 112. Thus, reliability of electrical insulation may be further improved.

In still other embodiments, after the integrated circuit 103 and the metal interconnection 152 are formed, the through-via 120 may be formed. Thus, it may be possible to form the semiconductor device 1 including the electrical connection part 12 having the via-last structure illustrated in FIG. 2B. Alternatively, after the through-via 120 is formed, the integrated circuit 103 and the metal interconnection 152 may be formed. Thus, it may be possible to form the semiconductor device 1 including the electrical connection part 13 having the via-first structure illustrated in FIG. 2C.

FIGS. 6A to 6E are cross-sectional views illustrating a method for fabricating a semiconductor device according to still other embodiments of the inventive concept.

Referring to FIG. 6A, a via-hole 101 may be formed in a substrate 100 and then a sacrificial layer 110 and an insulating layer 112a may be formed in the via-hole 101. The sacrificial layer 110 may be formed using a spin coating method, a spray coating method, an SOG method, or an FCVD method. In the present embodiment, the sacrificial layer 110 may be formed by the FCVD method, such that the sacrificial layer 110 may be formed to fill a lower part of the via-hole 101 by a single step.

According to a condition of the FCVD method, the sacrificial layer 110 may be thicker than the insulating layer 112a on the bottom surface 101f of the via-hole 101, and the sacrificial layer 110 may be thinner than the insulating layer 112a or have no thickness on the inner sidewall of the via-hole 101 and the top surface 100a of the substrate 100. In other embodiments, a silicon oxide layer, a silicon nitride layer, or a polymer layer may be deposited to completely fill the via-hole 101 and then it may be etched, so that the sacrificial layer 110 may be formed to fill the lower part of the via-hole 101 by two steps. A silicon oxide layer or a silicon nitride layer may be deposited by a CVD method, thereby forming the insulating layer 112a extending along a surface of the sacrificial layer 110 and the inner sidewall 101s of the via-hole 101.

Referring to FIG. 6B, a conductive layer may be deposited to fill the via-hole 101 and then planarized. By the planarization, the conductive layer may be formed into a through-via 120 confined in the via-hole 101, and the insulating layer 112a may be formed into a via-insulating layer 112 electrically insulating the through-via 120 from the substrate 100.

Referring to FIG. 6C, the back-end process may be performed to form the metal interconnection 152, the bonding pad 154, and the second interlayer insulating layer 106 on the first interlayer insulating layer 104. And then the upper insulating layer 107 and the upper terminal 108 may be formed on the second interlayer insulating layer 106. Thereafter, the first bottom surface 100b of the substrate 100 may be recessed to form the second bottom surface 100c having a level not exposing the through-via 120. Even though the substrate 100 is recessed, the sacrificial layer 110 may prevent the through-via 120 from being exposed outside the second bottom surface 100c. Thus, it is possible to reduce or prevent contamination and/or particles caused by exposure of the through-via 120.

Referring to FIG. 6D, a lower insulating layer 109 may be formed on the second bottom surface 100c and then the lower insulating layer 109 and the sacrificial layer 110 may be partially etched using a mask 130. Thus, it is possible to form an opening 132 having a width smaller than a width of the via-hole 101. The via-insulating layer 112 may extend to the bottom end 120b of the through-via 120 and a residual sacrificial layer 110b may extend from the via-insulating layer 112 to the second bottom surface 100c of the substrate 100. The residual sacrificial layer 110b may define an inner sidewall of the opening 132. The residual sacrificial layer 110b may prevent the substrate 100 from being exposed through the opening 132 and prevent the substrate 100 from being in contact with the lower terminal 118, as in FIG. 6E. The mask 130 may be removed by an ashing process. The residual sacrificial layer 110b may have a thickness equal to or similar to a thickness of the via-insulating layer 112 as equal to or similar to FIG. 4J. A width (i.e., a horizontal distance) of the opening 132 may be equal to or similar to a width (i.e., a horizontal distance) of the through-via 120. Alternatively, as equal to or similar to FIG. 4K, the residual sacrificial layer 110b may have a thickness greater than that of the via-insulating layer 112 and the width (i.e., a horizontal distance) of the opening 132 may be smaller than the width (i.e., a horizontal distance) of the through-via 120.

Referring to FIG. 6E, a lower terminal 118 may be formed on the lower insulating layer 109. The lower terminal 118 may extend in the opening 132 so as to be connected to the through-via 120. The lower terminal 118 may be electrically insulated from the substrate 100 by the residual sacrificial layer 110b and the lower insulating layer 109. As a result, it is possible to form the semiconductor device 1 of FIG. 1 including the electrical connection part 11b of the via-middle structure having the recessed through-via 120.

FIGS. 7A to 7E are cross-sectional views illustrating a method for fabricating a semiconductor device according to even other embodiments of the inventive concept. FIGS. 8A and 8B are cross-sectional views illustrating a method for fabricating a semiconductor device according to yet other embodiments of the inventive concept. FIG. 8A illustrates a modified example of FIG. 8A and FIG. 8B illustrates a modified example of FIG. 7E.

Referring to FIG. 7A, after a via-hole 101 is formed in a substrate 100, an insulating layer 112a may be formed to extend along an inner sidewall 101s and the bottom surface 101f of the via-hole 101. Subsequently, a sacrificial layer 110 may be formed to fill a lower part of the via-hole 101. The insulating layer 112a may be formed using a CVD method. The sacrificial layer 110 may be formed by a single step using an FCVD method or be formed by two steps using a CVD method and an etching process. The sacrificial layer 110 may have a thickness greater than that of the insulating layer 112a.

In other embodiments, as illustrated in FIG. 8A, a second insulating layer 113a may be formed to extend along surfaces of the insulating layer 112a and the sacrificial layer 110. The second insulating layer 113a may be formed by a CVD method. The second insulating layer 113a may have a thickness smaller than that of the sacrificial layer 110.

Referring to FIG. 7B, a conductive layer may be formed on the substrate 100 to fill the via-hole 101 and then the conductive layer may be planarized. By the planarization, the conductive layer may be formed into a through-via 120 confined in the via-hole 101 and the insulating layer 112a may be formed into a via-insulating layer 112 surrounding the through-via 120 and the sacrificial layer 110.

Referring to FIG. 7C, the back-end process may be performed to form the metal interconnection 152, the bonding pad 154, and the second interlayer insulating layer 106 on the first insulating layer 104. Additionally, the upper insulating layer 107 and the upper terminal 108 may be formed on the second interlayer insulating layer 106. Subsequently, the first bottom surface 100b of the substrate 100 may be recessed to form the second bottom surface 100c having a level not exposing the through-via 120. The through-via 120 may not be exposed by the sacrificial layer 110 during the recess process of the substrate 100.

Referring to FIG. 7D, a lower insulating layer 109 may be formed on the second bottom surface 100c of the substrate and then the lower insulating layer 109 and the sacrificial layer 110 may be patterned by an etching process using a mask 130. Thus, an opening 132 may be formed to expose the through-via 120. The sacrificial layer 110 may be completely removed, so that the via-insulating layer 112 may define an inner sidewall of the opening 132. The via-insulating layer 112 may extend along the sidewall of the through-via 120 to the second bottom surface 100c of the substrate 100. Thus, the via-insulating layer 112 may prevent the substrate 100 from being exposed through the opening 132 and prevent the through-via from being in contact with the substrate 100. In other embodiments, a portion of the sacrificial layer 110 may remain to form a residual sacrificial layer 110c defining the inner sidewall of the opening 132. The mask 130 may be removed by an ashing process.

Referring to FIG. 7E, a lower terminal 118 may be formed on the lower insulating layer 109. The lower terminal 118 may be enlarged through the opening 132 so as to be connected to the through-via 120. As a result, it is possible to form the semiconductor device 1 of FIG. 1 including the electrical connection part 11c of the via-middle structure having the recessed through-via 120.

In other embodiments, if the second insulating layer 113a is formed as illustrated in FIG. 8A, an electrical connection part 11d further including a second via-insulating layer 113 may be formed as illustrated in FIG. 8B. The second via-insulating layer 113 may be formed between the through-via 120 and the via-insulating layer 112. The via-insulating layer 112 may extend to the second bottom surface 100c of the substrate 100 and the second via-insulating layer 113 may extend to the bottom end 120b of the through-via 120.

FIGS. 9A to 9E are cross-sectional views illustrating a method for fabricating a semiconductor device according to yet still other embodiments of the inventive concept.

Figure 9A:
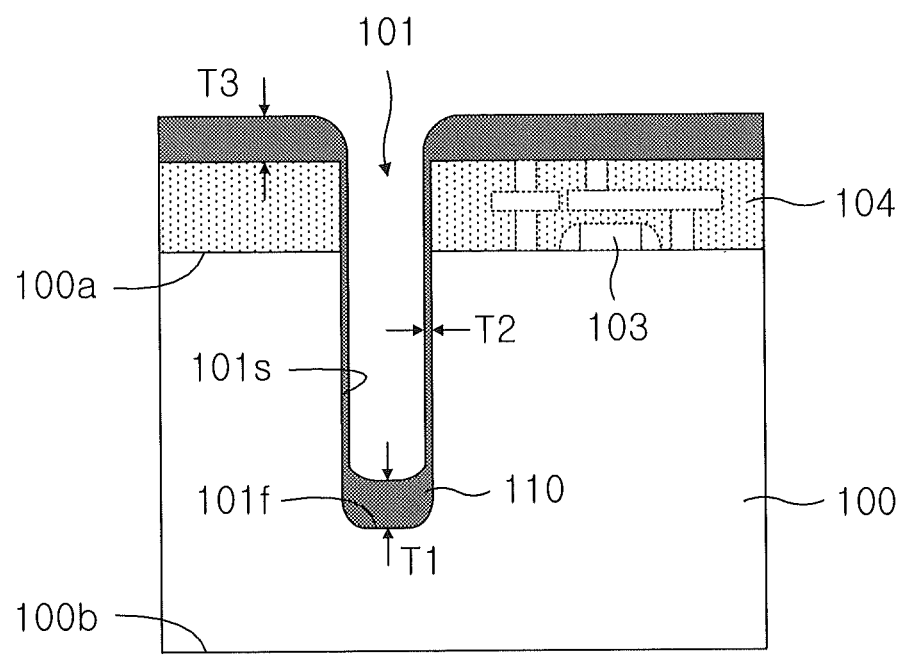
FIGS. 9A to 9E are cross-sectional views illustrating a method for fabricating a semiconductor device according to other embodiments of the inventive concept.

Referring to FIG. 9A, a via-hole 101 may be formed in a substrate 100 and then a sacrificial layer 110 may be formed on the substrate 100. The sacrificial layer 110 may have a thin thickness T2 on the inner sidewall 101s of the via hole 101 and a thick thickness T1 on the bottom surface 101f of the via-hole 101 (T1>T2). The sacrificial layer 110 may also have a thick thickness T3 on the top surface 100a of the substrate 100 (T3>T2). The sacrificial layer 110 may be formed by an FCVD method.

In other embodiments, an insulating layer 112a may further be formed before the sacrificial layer 110 as illustrated in FIG. 5A. In still other embodiments, as illustrated in FIG. 6A, after the sacrificial layer 110 may be formed to fill a lower part of the via-hole 101, the insulating layer 112a may be formed. In yet other embodiments, as illustrated in FIG. 7A, after the insulating layer 112a may be formed, the sacrificial layer 110 may be formed to fill a lower part of the via-hole 101. In yet still other embodiments, a illustrated in FIG. 8A after the insulating layer 112a may be formed, the sacrificial layer 110 may be formed to fill a lower part of the via-hole 101 and then the second insulating layer 113a may be formed.

Figure 9B:
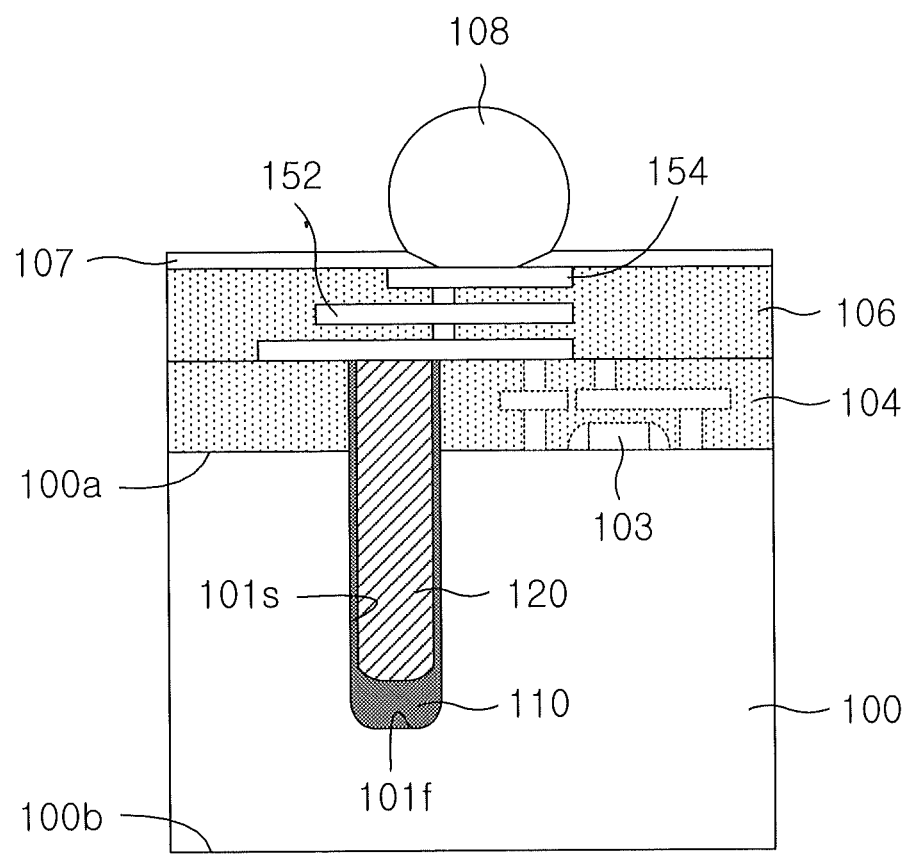

Referring to FIG. 9B, after a conductive layer may be formed, the conductive layer may be planarized to form a through-via 120 surrounded by the sacrificial layer 110. Subsequently, the back-end process may be performed to form the metal interconnection 152, the bonding pad 154, and the second interlayer insulating layer 106 on the first interlayer insulating layer 104. And then the upper insulating layer 107 and the upper terminal 108 may be formed on the second interlayer insulating layer 106.

Figure 9C:
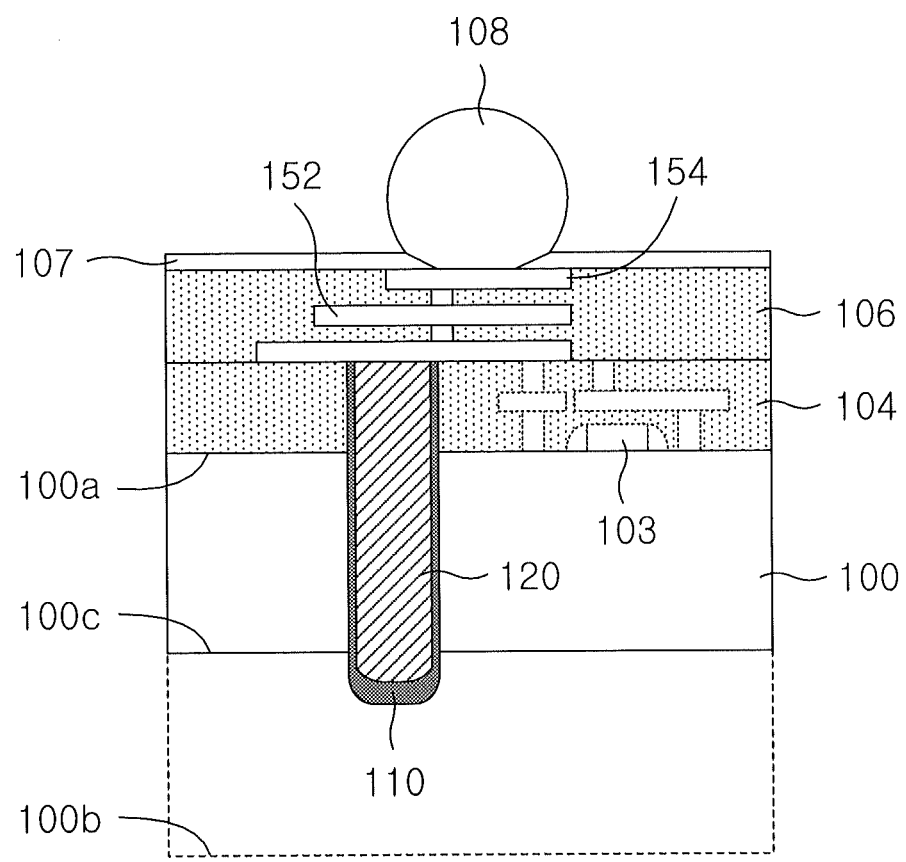

Referring to FIG. 9C, the substrate 100 may be recessed to protrude the through-via 120. For example, the first surface 100b of the substrate may be removed by an etching process, a CMP process, a grinding process, or any combination thereof which may use etchant or slurry capable of selectively removing the substrate 100. The recess process may be performed until a second bottom surface 100c capable of protruding the through-via 120 is exposed. When the first bottom surface 100b of the substrate 100 is etched, the sacrificial layer 110 may be partially etched to be recessed. In the present embodiment, the sacrificial layer 110 may be relatively thick under the through-via 120 as described with reference to FIG. 9A, so that the through-via 120 may be prevented from being exposed during the recess process of the substrate 100. Thus, it may be possible to prevent the contamination or particles caused by the exposure of the through-via 120.

Figure 9D:
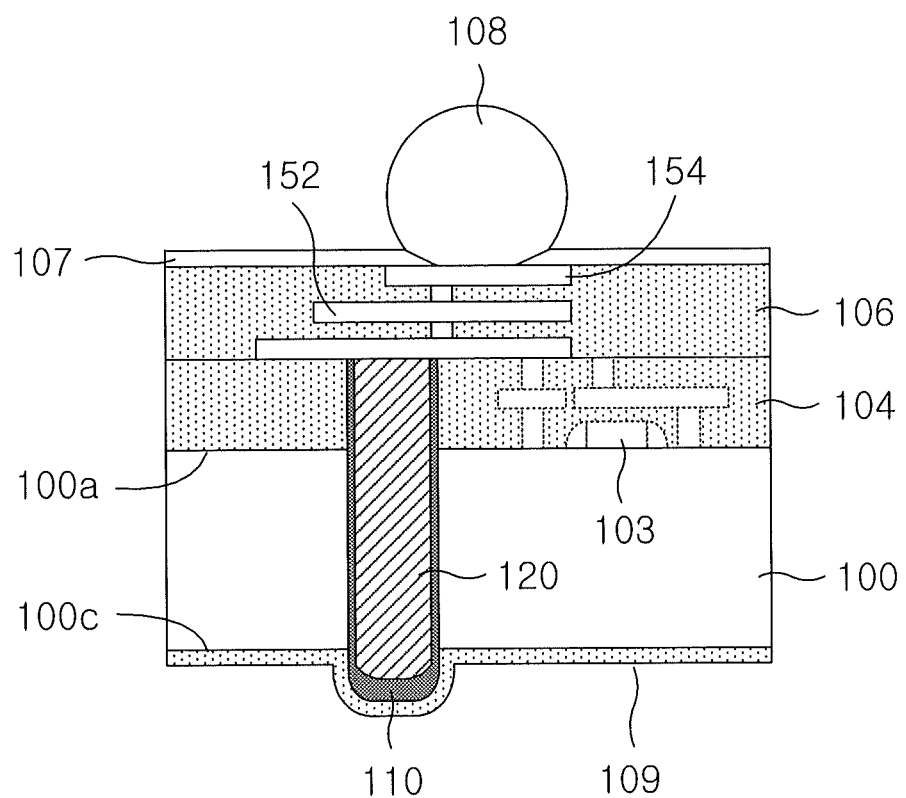

Referring to FIG. 9D, a lower insulating layer 109 may be formed on the second bottom surface 100c of the substrate 100. The lower insulating layer 109 may cover the second bottom surface 100c of the substrate 100 and the sacrificial layer 110. The lower insulating layer 109 and the sacrificial layer 110 may be planarized until the through-via 120 is exposed.

Figure 9E:
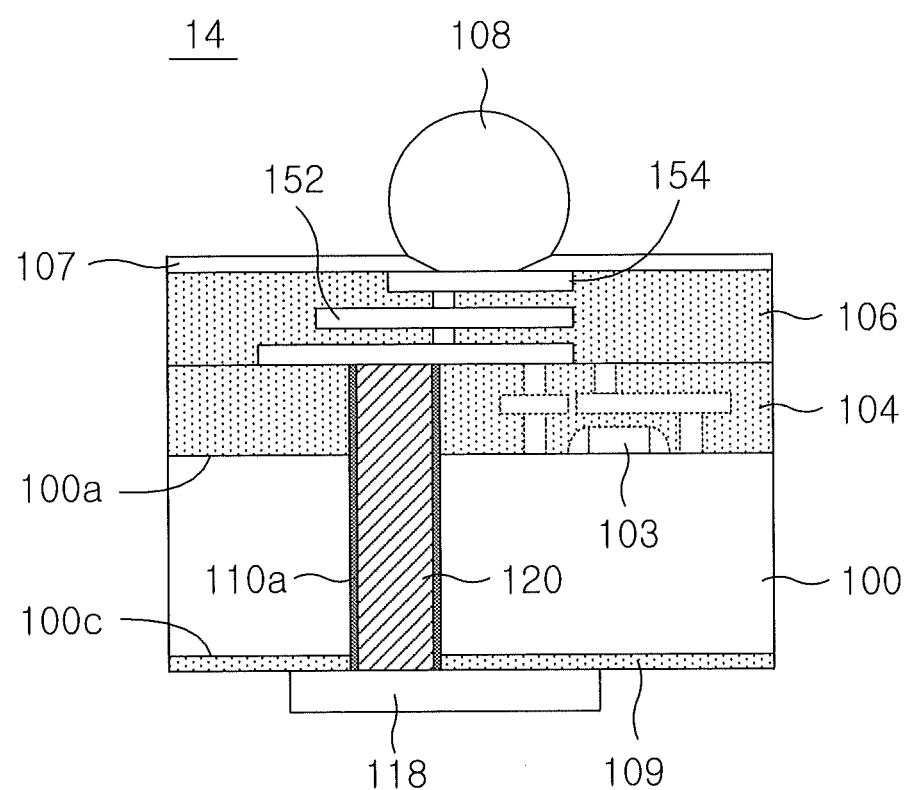

Referring to FIG. 9E, a residual sacrificial layer 110a may be formed by the planarization of the lower insulating layer 109 and the sacrificial layer 110. The residual sacrificial layer 110a may extend along the sidewall of the through-via 120 and penetrate the lower insulating layer 109. The residual sacrificial layer 110a may function as a via-insulating layer electrically insulating the through-via 120 from the substrate 100. A sidewall of a bottom end portion of the through-via 120 may be surrounded by the residual sacrificial layer 110a and the lower insulating layer 109. A lower terminal 118 connected to the through-via 120 may be formed on the lower insulating layer 109. As a result, it may be possible to form the semiconductor device 1 of FIG. 1 including the electrical connection part 14 of the via-middle structure of FIG. 2D having the protruded through-via 120. In other embodiments, the electrical connection part 14 may be formed to have the via-last structure as illustrated in FIG. 2B or the via-first structure as illustrated in FIG. 2C.

Figure 10A:
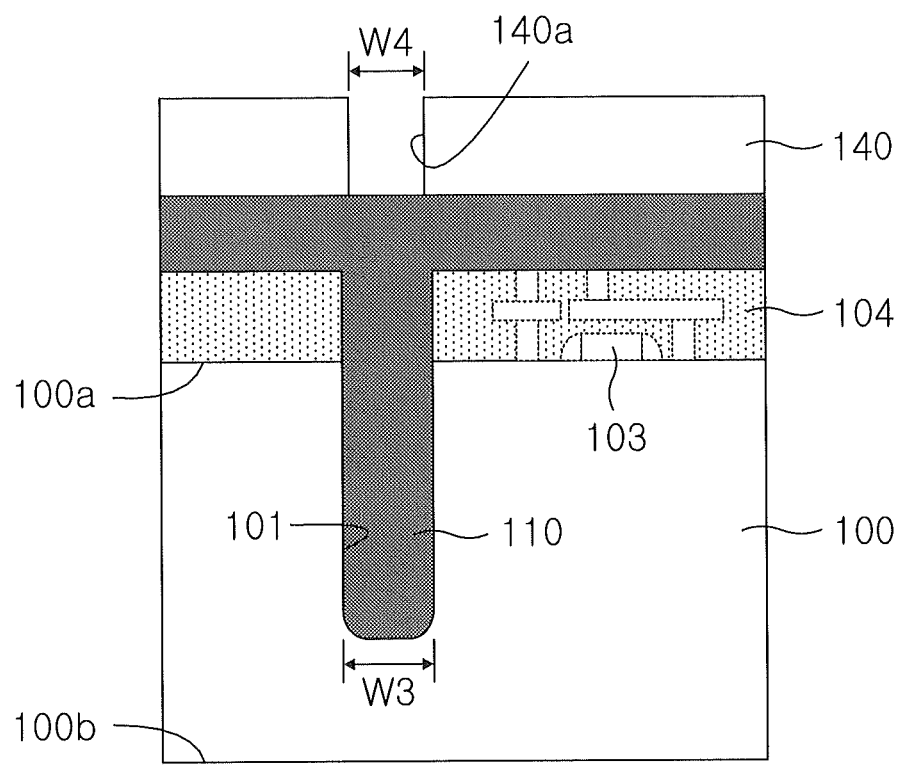
FIGS. 10A and 10B are cross-sectional views illustrating a method for fabricating a semiconductor device according to further embodiments of the inventive concept.
Figure 10B:
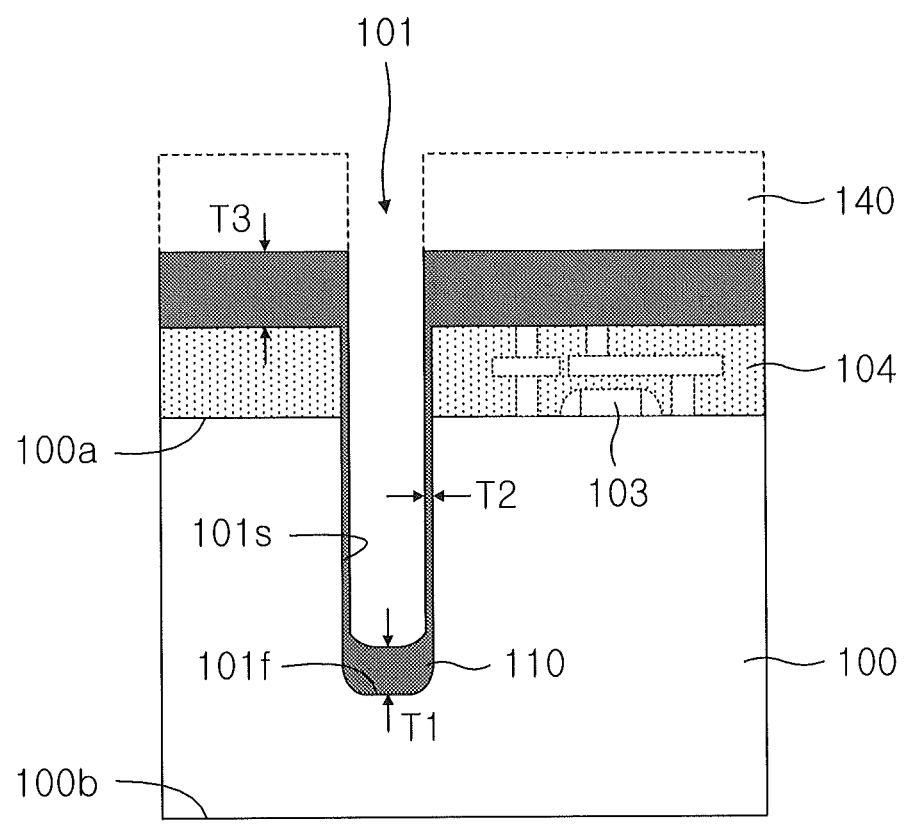

FIGS. 10A and 10B are cross-sectional views illustrating a method for fabricating a semiconductor device according to further embodiments of the inventive concept.

Referring to FIG. 10A, the via-hole 101 may be formed in the substrate 100 and then a sacrificial layer 110 may be formed to fill the via-hole 101. The sacrificial layer 101 may be formed using a spin coating method, a spray coating method, an SOG method, or an FCVD method. In the present embodiment, the sacrificial layer 110 may completely fill the via-hole 101 and cover the top surface 100a of the substrate 100 by the FCVD method. Subsequently, a mask 140 may be formed on the sacrificial layer 110 by, for example, a process coating a photoresist and a process patterning the photoresist. The mask 140 may include an opening pattern 140a vertically aligned with the via-hole 101. The opening pattern 140a may have a hollow pillar-shape equal to or similar to the via-hole 101. The opening pattern 140a may have a width W4 smaller than a width W3 of the via-hole 101 (W4<W3).

Referring to FIG. 10B, the sacrificial layer 110 may be patterned by a dry etching process using the mask 140. Thus, the sacrificial layer 110 may be patterned to have the thick thickness T1 on the bottom surface 101f of the via-hole 101 and the thin thickness T2 on the inner sidewall 101s of the via-hole 101 (T2<T1). The patterned sacrificial layer 110 may also have the thick thickness T3 on the top surface 100a of the substrate 100 (T3>T2).

Subsequently, the same processes as or processes similar to the processes described with reference to FIGS. 4B to 4M may be performed to form the semiconductor device 1 of FIG. 1 including the electrical connection part 11 as illustrated in or similar to FIG. 4M.

In other embodiments, as illustrated in FIG. 5A, after the insulating layer 112a is formed to extend along an inner surface of the via-hole 101, the sacrificial layer 110 may be formed to completely fill the via-hole 101. Thus, as illustrated in FIG. 5B, the electrical connection part 11a including the via-insulating layer 112 may be formed. The via-insulating layer 112 may be formed between the substrate 100 and the residual sacrificial layer 110a.

Figure 11A:
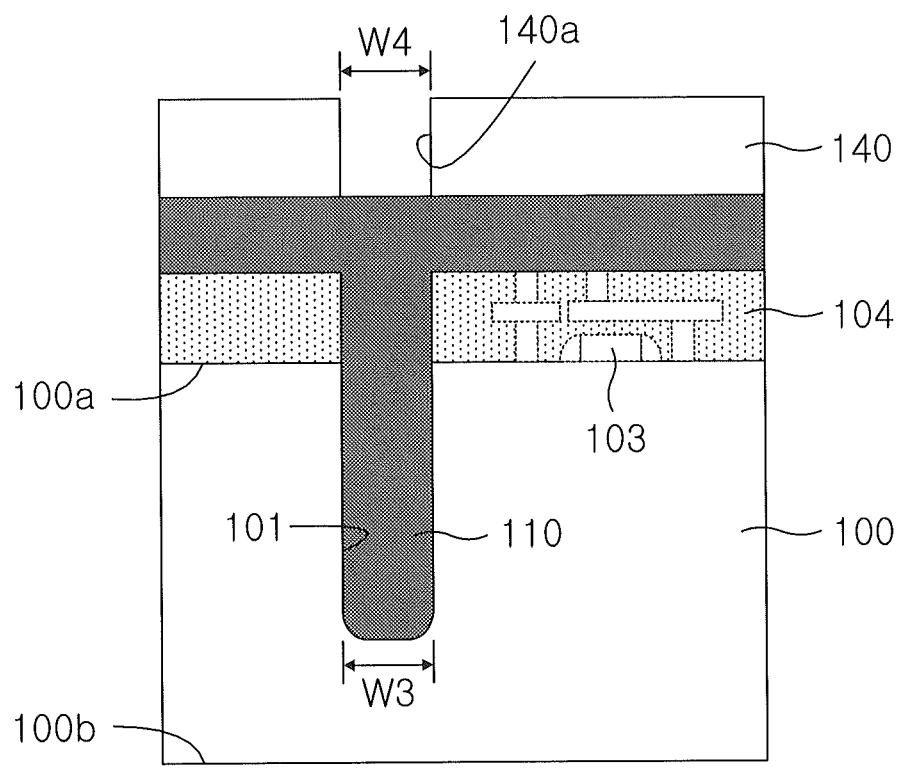
FIGS. 11A and 11B are cross-sectional views illustrating a method for fabricating a semiconductor device according to still further embodiments of the inventive concept.
Figure 11B:
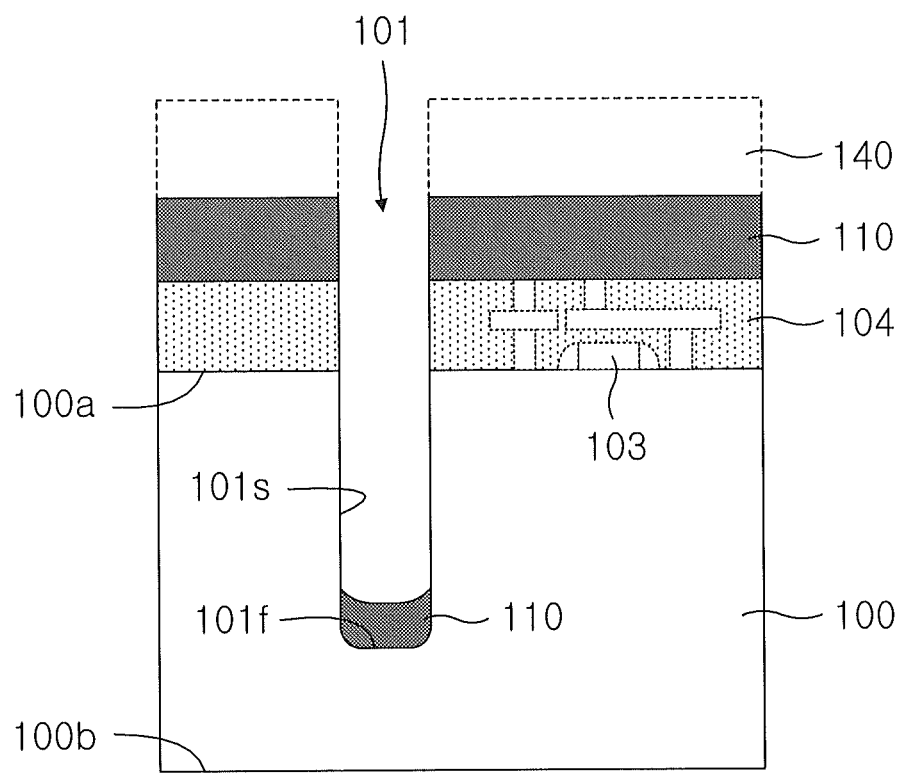

FIGS. 11A and 11B are cross-sectional views illustrating a method for fabricating a semiconductor device according to still further embodiments of the inventive concept.

Referring to FIG. 11A, the via-hole 101 may be formed in the substrate 100 and then the sacrificial layer 110 may be formed to completely fill the via-hole 101 by, for example, the FCVD method. Subsequently, a mask 140 may be formed to have an opening pattern 140a vertically aligned with the via-hole 101. The opening pattern 140a may have a width W4 equal to or similar to the width W3 of the via-hole 101.

Referring to FIG. 11B, the sacrificial layer 110 may be patterned by a dry etching process using the mask 140. Thus, the sacrificial layer 110 may be patterned to have a shape filling a lower part of the via-hole 101 as illustrated in or similar to FIG. 6A. In the present embodiment, the sacrificial layer 110 may remain on the top surface 100a of the substrate 100.

Next, the same processes as or processes similar to the processes described with reference to FIGS. 6A to 6E may be performed to form the semiconductor device 1 including the electrical connection part 11b as illustrated in or similar to FIG. 6E.

In other embodiments, the same processes as or processes similar to the processes described with reference to FIGS. 7A to 7E may be performed to form the electrical connection part 11c as illustrated in or similar to FIG. 7E. In still other embodiments, the same processes as or processes similar to the processes described with reference to FIGS. 8A and 8B may be performed to form the electrical connection part 11d as illustrated in or similar to FIG. 8B.

Figure 12A:
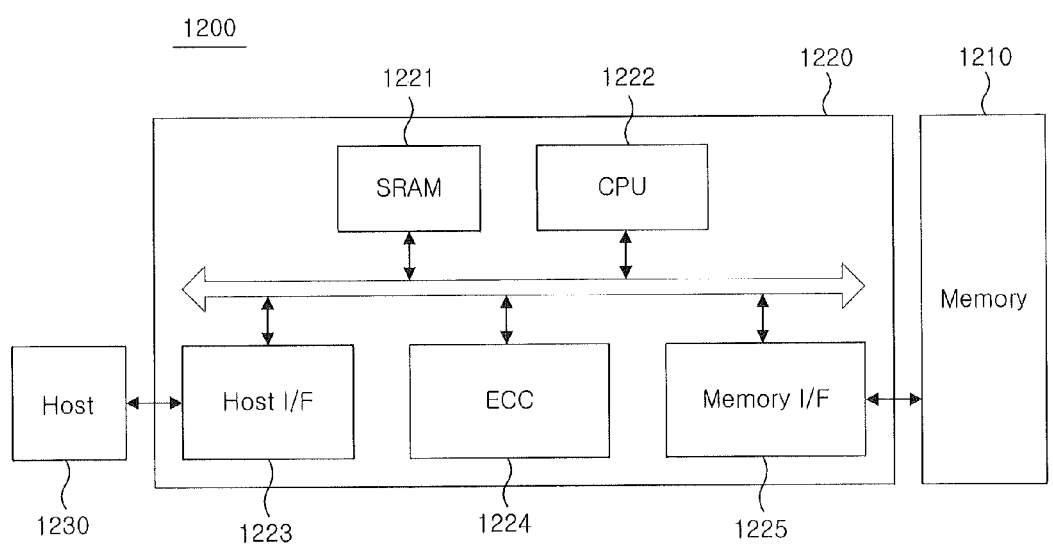
FIG. 12A is a schematic block diagram illustrating an example of memory cards including semiconductor devices according to embodiments of the inventive concept.
Figure 12B:
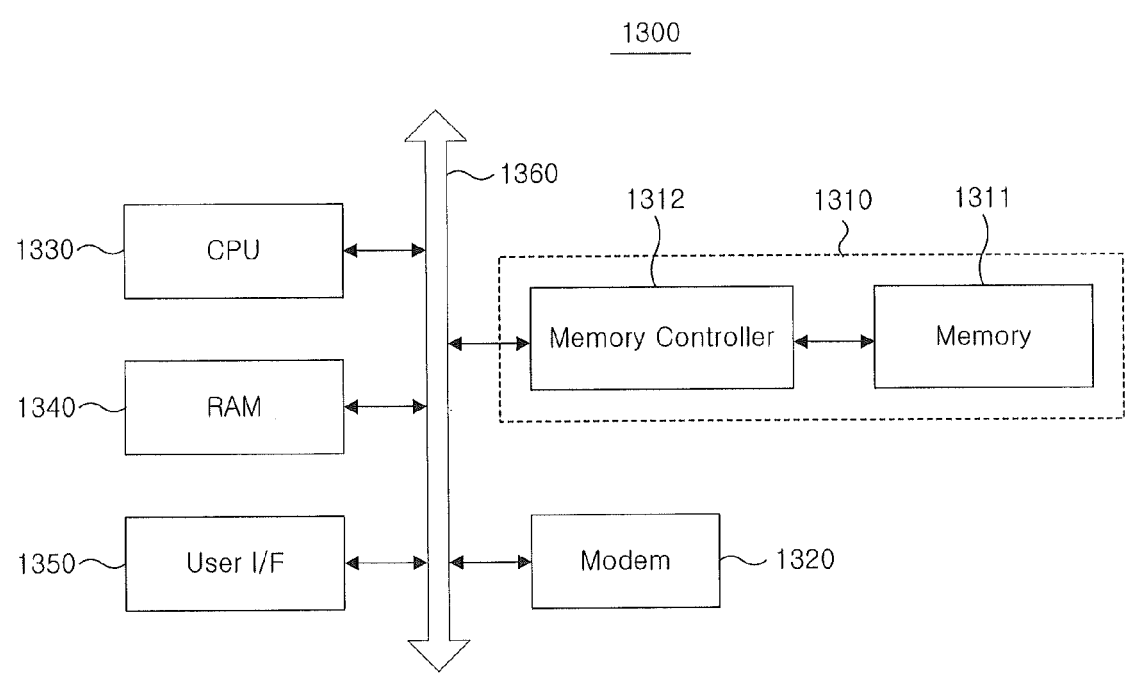
FIG. 12B is a schematic block diagram illustrating an example of information processing systems including semiconductor devices according to embodiments of the inventive concept.

FIG. 12A is a schematic block diagram illustrating an example of memory cards including semiconductor devices according to embodiments of the inventive concept, and FIG. 12B is a schematic block diagram illustrating an example of information processing systems including semiconductor devices according to embodiments of the inventive concept.

Referring to FIG. 12A, a memory card 1200 may include a memory controller 1220 that controls data communication between a host 1230 and the memory device 1210. An SRAM device 1221 may be used as an operation memory of a central processing unit (CPU) 1222. A host interface unit 1223 may be configured to include a data communication protocol between the memory card 1200 and the host 1230. An error check and correction (ECC) block 1224 may detect and correct errors of data which are read out from the memory device 1210. A memory interface unit 1225 may interface with the memory device 1210. The CPU 1222 may perform overall operations for data exchange of the memory controller 1220. The memory device 1210 may include at least one of the semiconductor device 1 and the semiconductor package 90 according to embodiments of the inventive concept.

Referring to FIG. 12B, an information processing system 1300 may include a memory system 1310 provided with at least one of the semiconductor device 1 and the semiconductor package 90 according to embodiments of the inventive concept. The information process system 1300 may include a mobile device or a computer. For example, the information system 1300 may include the memory system 1310, a modem 1320, a central processing unit (CPU) 1330, a RAM 1340, and a user interface unit 1350. The memory system 1310 may include a memory device 1311 and a memory controller 1312. The memory system 1310 may consist of the same elements as the memory card 1200 of FIG. 12A. The memory system 1310 may store data processed by the CPU 1330 or data inputted from an external system. The information processing system 1300 may further include a memory card, a solid state disk (SSD), and/or other application chipsets.

According to embodiments of the inventive concept, the relative thick flowable chemical vapor deposition layer may be formed under the through-via, such that a process margin may be sufficiently secured. Thus, it is possible to prevent the contamination or particles caused by exposure of the through-via. As a result, yield of the semiconductor devices may be improved and electric characteristics of the semiconductor devices may be improved. Additionally, the flowable chemical vapor deposition layer may compensate for differences between substrate recessing amounts or depths of the via-holes, so that process errors may be prevented or minimized.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A semiconductor device comprising:
   a substrate having an active surface and a non-active surface on a side of the substrate that is opposite to the active surface;
   a via-hole penetrating the substrate;
   a first via-insulating layer extending along an inner sidewall of the via-hole from the active surface to the non-active surface;
   a through-via disposed in the via-hole and surrounded by the first via-insulating layer, a bottom end of the through-via not reaching the non-active surface;
   a lower insulating layer on the non-active surface of the substrate; and
   a terminal disposed on the lower insulating layer and connected to the bottom end of the through-via,
   wherein the terminal includes a protrusion extending toward the bottom end of the through-via and connected to the bottom end of the through-via, and
   wherein the first via-insulating layer electrically insulates the protrusion from the substrate.

2. The semiconductor device of claim 1, further comprising:
   a second via-insulating layer disposed between the through-via and the first via-insulating layer and surrounding a sidewall of the through-via.

3. The semiconductor device of claim 2, wherein the second via-insulating layer extends along the sidewall of the through-via from the active surface to the non-active surface or from the active surface to the bottom end of the through electrode.

4. The semiconductor device of claim 1, wherein the first via-insulating layer comprises:
   a first insulating layer extending along a sidewall of the through-via to the bottom end of the through-via and electrically insulating the through-via from the substrate; and
   a second insulating layer extending from the first insulating layer to the non-active surface of the substrate and electrically insulating the terminal from the substrate.

5. The semiconductor device of claim 1, wherein the first via-insulating layer includes a first insulating layer in contact with the through-via and a second insulating layer not in contact with the through-via, the first insulating layer having a first thickness and the second insulating layer having a second thickness substantially identical to the first thickness.

6. The semiconductor device of claim 1, wherein the first via-insulating layer includes a first insulating layer in contact with the through-via and a second insulating layer not in contact with the through-via, the first insulating layer having a first thickness and the second insulating layer having a second thickness greater than the first thickness.

7. The semiconductor device of claim 1, wherein the first via-insulating layer includes a first insulating layer in contact with the through-via and a second insulating layer not in contact with the through-via, the first insulating layer having a first thickness and the second insulating layer having a second thickness less than the first thickness.

* * * * *